(12) United States Patent
Hirashima et al.

(10) Patent No.: US 11,621,712 B2
(45) Date of Patent: Apr. 4, 2023

(54) SEMICONDUCTOR DEVICE

(71) Applicant: KIOXIA CORPORATION, Tokyo (JP)

(72) Inventors: Yasuhiro Hirashima, Kawasaki Kanagawa (JP); Masaru Koyanagi, Ota Tokyo (JP); Yutaka Takayama, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/473,012

(22) Filed: Sep. 13, 2021

(65) Prior Publication Data

US 2021/0409023 A1 Dec. 30, 2021

Related U.S. Application Data

(60) Continuation of application No. 17/000,708, filed on Aug. 24, 2020, now Pat. No. 11,121,710, which is a
(Continued)

(30) Foreign Application Priority Data

Jun. 28, 2017 (JP) .............................. JP2017-126189

(51) Int. Cl.
*G11C 7/10* (2006.01)
*H03K 3/00* (2006.01)
(Continued)

(52) U.S. Cl.
CPC ................ *H03K 19/017509* (2013.01); *H01L 23/5384* (2013.01)

(58) Field of Classification Search
None
See application file for complete search history.

(56) References Cited

U.S. PATENT DOCUMENTS 6,025,738 A 2/2000 Masleid
6,111,446 A 8/2000 Keeth
(Continued)

FOREIGN PATENT DOCUMENTS

CN 102739230 A 10/2012
JP 3510507 B2 3/2004
(Continued)

OTHER PUBLICATIONS

Chinese Office Action dated Nov. 3, 2021 in related Chinese Patent Application 201810088613.3 with English Translation, 18 pages.
(Continued)

*Primary Examiner* — Kenneth B Wells
(74) *Attorney, Agent, or Firm* — Kim & Stewart LLP

(57) ABSTRACT

A semiconductor device includes a latch circuit including a first inverter configured to output a first signal based on an input signal, a second inverter configured to output a first clock signal based on a first strobe signal, a third inverter configured to output a second clock signal based on a second strobe signal, a first clock generation circuit configured to generate a third clock signal having transitions that are delayed with respect to the first clock signal, a second clock generation circuit configured to generate a fourth clock signal having transitions that are delayed with respect to the second clock signal, a fourth inverter configured to output an inversion signal of the first signal in accordance with the third and fourth clock signals, and a data latch circuit configured to latch an output signal of the fourth inverter.

8 Claims, 14 Drawing Sheets

Related U.S. Application Data division of application No. 16/571,023, filed on Sep. 13, 2019, now Pat. No. 10,784,866, which is a division of application No. 15/907,264, filed on Feb. 27, 2018, now Pat. No. 10,461,750.

(51) Int. Cl.
*H03K 19/0175* (2006.01)
*H01L 23/538* (2006.01)

(56) References Cited

U.S. PATENT DOCUMENTS

| | | |
|---|---|---|
| 6,255,875 B1 | 7/2001 | Gabara |
| 6,310,501 B1 | 10/2001 | Yamashita |
| 6,519,189 B2 | 2/2003 | Jung |
| 7,123,520 B2 | 10/2006 | Seo et al. |
| 7,479,806 B2 | 1/2009 | Teh et al. |
| 8,243,502 B2 | 8/2012 | Sakimura et al. |
| 8,867,302 B2 | 10/2014 | Kwon et al. |
| 8,879,335 B2 | 11/2014 | Koyanagi et al. |
| 8,952,740 B2 | 2/2015 | Luo |
| 10,461,750 B2 | 10/2019 | Hirashima et al. |
| 10,679,710 B2* | 6/2020 | Hirashima ......... G11C 16/0483 |
| 11,121,710 B2* | 9/2021 | Hirashima ......... H01L 23/5384 |
| 2010/0219867 A1 | 9/2010 | Choi et al. |
| 2012/0250423 A1 | 10/2012 | Koyanagi et al. |
| 2013/0121091 A1 | 5/2013 | Koshizuka |
| 2019/0295661 A1 | 9/2019 | Hirashima et al. |

FOREIGN PATENT DOCUMENTS

| | | |
|---|---|---|
| JP | 3559712 B2 | 9/2004 |
| JP | WO2002099810 A1 | 9/2004 |
| JP | 2012-216265 A | 11/2012 |
| JP | 5224657 B2 | 7/2013 |
| WO | 02099810 A1 | 12/2002 |

OTHER PUBLICATIONS

Taiwanese Office Action dated Jan. 9, 2023 in corresponding TW Patent Application 111108272, 5 pages.

* cited by examiner

SEMICONDUCTOR DEVICE

CROSS-REFERENCE TO RELATED APPLICATION

This application is a continuation of U.S. patent application Ser. No. 17/000,708, filed Aug. 24, 2020, now U.S. Pat. No. 11,121,710, issued Sep. 14, 2021, which application is a divisional of U.S. patent application Ser. No. 16/571,023, filed Sep. 13, 2019, now U.S. Pat. No. 10,784,866, issued Sep. 22, 2020, which application is a divisional of U.S. patent application Ser. No. 15/907,264, filed Feb. 27, 2018, now U.S. Patent No. 10,461,750, issued Oct. 29, 2019, which application is based upon and claims the benefit of priority from Japanese Patent Application No. 2017-126189, filed Jun. 28, 2017, the entire contents of which are incorporated herein by reference.

FIELD

Embodiments described herein relate generally to a semiconductor device.

BACKGROUND

A semiconductor device in which a core chip is stacked on an interface chip provided on a semiconductor substrate, through a through-silicon via (TSV) is known.

DETAILED DESCRIPTION

Embodiments provide a semiconductor device in which it is possible to improve processing speed.

In general, according to one embodiment, there is a semiconductor device which includes an input/output (IO) signal receiver circuit and a latch circuit. The latch circuit includes a first inverter configured to output a first signal based on an input signal received from the IO signal receiver circuit, a second inverter configured to output a first clock signal based on a first strobe signal, a third inverter configured to output a second clock signal based on a second strobe signal which is an inversion signal of the first strobe signal, a first clock generation circuit a first clock generation circuit which is connected to an output terminal of the second inverter and is configured to generate a third clock signal from the first clock signal, wherein logical level transitions in the third clock signal are delayed with respect to the first clock signal and are completed in a shorter amount of time than the first clock signal, a second clock generation circuit which is connected to an output terminal of the third inverter and is configured to generate a fourth clock signal from the second clock signal, wherein logical level transitions in the fourth clock signal are delayed with respect to the second clock signal and are completed in a shorter amount of time than the first clock signal, a fourth inverter configured to output an inversion signal of the first signal in accordance with the third and fourth clock signals, and a data latch circuit configured to latch an output signal of the fourth inverter in accordance with the third and fourth clock signals.

Hereinafter, embodiments will be described with reference to the drawings. In the descriptions, parts which are common with each other in all drawings are denoted by the same reference signs.

1. First Embodiment

A semiconductor device according to a first embodiment will be described. A memory system including a NAND flash memory will be described below as an example of a semiconductor device. In the first embodiment, a high-speed memory system of a DDR type will be described. However, it is not limited thereto. The memory system in the first embodiment may be a general memory system.

1. 1 Configuration 1. 1. 1 Overall Configuration of Memory System

First, an overall configuration of the memory system will be described with reference to FIG. 1.

Figure 1:
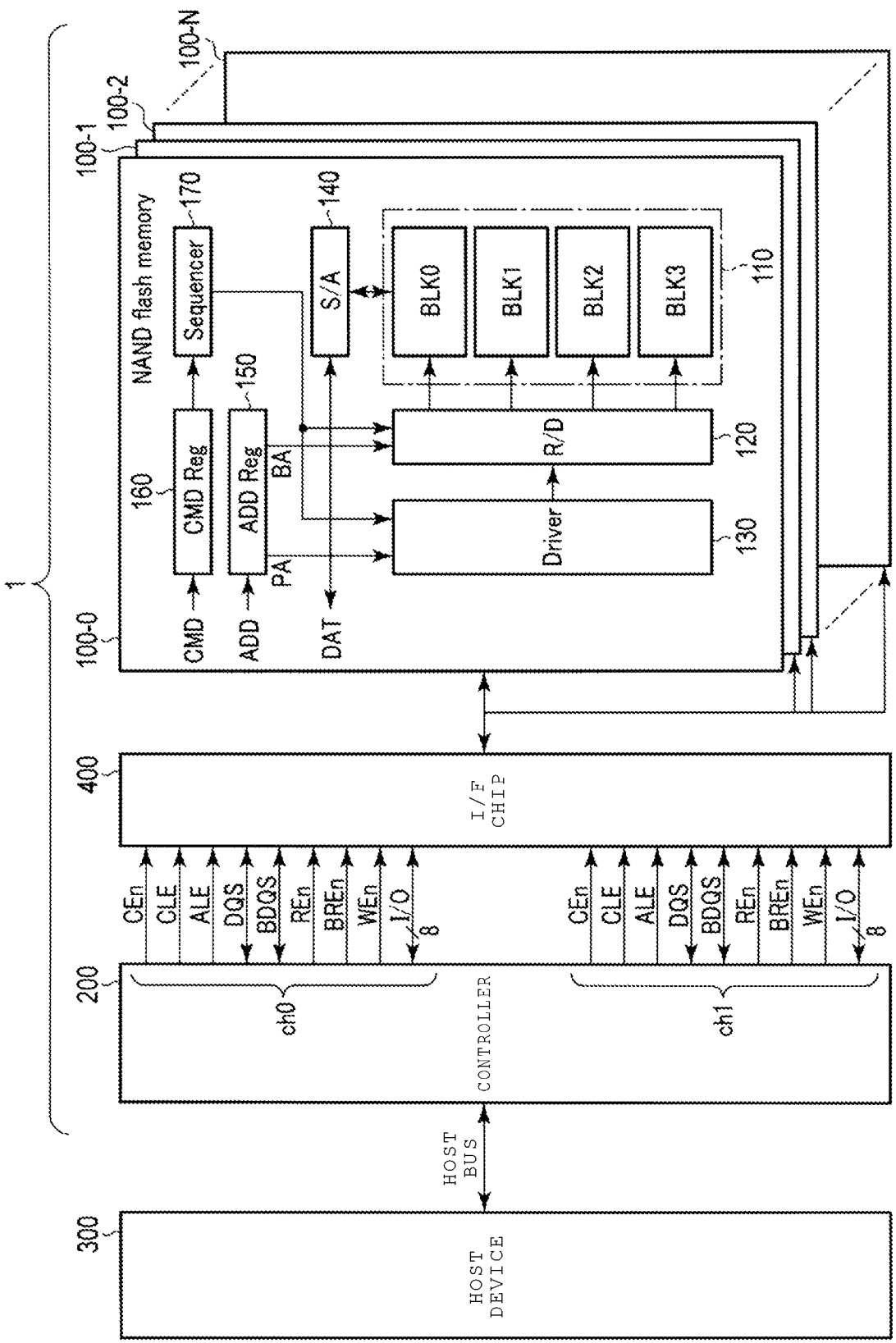
FIG. 1 is a block diagram illustrating a semiconductor device according to a first embodiment.

As illustrated in FIG. 1, a memory system 1 includes a plurality of NAND flash memory 100-0 to 100-N(N is any integer of 1 or more), an interface (I/F) chip 400, and a controller 200. In the first embodiment, when the NAND flash memory 100-0 to 100-N are not required to be distinguished from one another, they will be referred to "NAND flash memory 100". This applies to other components as well.

The NAND flash memory 100 includes a plurality of memory cells and stores data with in a non-volatile manner. In the first embodiment, the NAND flash memory 100 includes two channels ch0 and ch1. The number of channels provided in the NAND flash memory 100 may be one, or three or more or may be set to any value. The controller 200 is connected to the NAND flash memory 100 via the I/F chip 400 for each of the channels over a NAND bus. The controller 200 is connected to a host device 300 over a host bus. The controller 200 controls the NAND flash memory 100 via the I/F chip 400 for each of the channels. The controller 200 access the NAND flash memory 100 via the I/F chip 400 for each of the channels, in response to a command received from the host device 300. The host device 300 may be, for example, a digital camera or a personal computer. The host bus may be, for example, an SD® interface bus.

The NAND bus causes a signal to be transmitted and received in accordance with a NAND interface. In the first embodiment, as illustrated in FIG. 1, the controller 200 and the I/F chip 400 are connected to each other over an interface having two channels. Here, a case where a NAND interface is provided for each channel will be described. However, the same NAND interface may be used by the channels by using identification information of a channel, for example.

Specific examples of the signal include a chip enable signal CEn, an address latch enable signal ALE, a command latch enable signal CLE, a write enable signal WEn, a read enable signal REn, an input or output signal I/O, and a data strobe signal DQS.

The signal CEn is a signal used for causing the NAND flash memory 100 to be in an enable state. The chip enable signal CEn is asserted at a low level (also described as an "L" level below). The signal CLE is a signal used for notifying the NAND flash memory 100 that an input signal I/O to the NAND flash memory 100 indicates a command. The signal ALE is a signal used for notifying the NAND flash memory 100 that an input signal I/O to the NAND flash memory 100 indicates an address. The signal WEn is a signal which is input at a transition timing when a command or an address is transitioned from a low level to a high level (also described as an "H" level below). The signal REn is also asserted at a low level. The signal REn is a signal used for reading an output signal I/O from the NAND flash memory 100. The signal BREn is a complementary signal of the signal REn. The signal BREn is a signal used for reading an output signal I/O from the NAND flash memory 100.

The input or output signal I/O is, for example, a 8-bit signal. The input or output signal I/O represents an entity of data which is transmitted and received between the NAND flash memory 100 and the controller 200. As the input or output signal I/O, a command, an address, write data, data to be read, and the like are provided.

The signal DQS and a complementary signal BDQS of the signal DQS are output from a transmission side, along with the signal I/O. A clock signal for adjusting a timing of inputting data by receiving the signal DQS and the signal BDQS which are transmitted is provided on a data reception side.

1. 1. 2 Configuration of NAND Flash Memory

Next, a configuration of the NAND flash memory 100 will be described.

As illustrated in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes, for example, four blocks BLK (BLK0 to BLK3). Each of the four blocks BLK is an assembly of a plurality of nonvolatile memory cells which are correlated with rows and columns. Thus, the memory cell array 110 stores data assigned from the controller 200.

The row decoder 120 selects any of the blocks BLK0 to BLK3 and further selects a row in the selected block BLK.

The driver circuit 130 supplies a voltage to the selected block BLK via the row decoder 120.

When data is read, the sense amplifier 140 senses data read from the memory cell array 110 and performs computation required for the sensed data. Then, the sense amplifier 140 outputs the data DAT to the controller 200. When data is written, the sense amplifier 140 transfers data DAT which is received from the controller 200 and is to be written, to the memory cell array 110.

The address register 150 holds an address ADD received from the controller 200. The command register 160 holds a command CMD received from the controller 200.

The sequencer 170 controls the entire operation of the NAND flash memory 100, based on the command CMD which is held in the command register 160.

The NAND flash memory 100 may be a flat type NAND flash memory which includes a memory cell array 110 in which memory cells are two-dimensionally arranged on a semiconductor substrate, or may be a three-dimensional stacked type NAND flash memory which includes a memory cell array 110 in which memory cells are three-dimensionally arranged above a semiconductor substrate.

The configuration of the memory cell array 110 of the three-dimensional stacked type NAND flash memory is disclosed, for example, in: U.S. patent application Ser. No. 12/407,403, filed on Mar. 19, 2009 and entitled "THREE DIMENSIONAL STACKED NONVOLATILE SEMICONDUCTOR MEMORY," now U.S. Pat. No. 8,952,426; U.S. patent application Ser. No. 12/406,524, filed on Mar. 18, 2009 and entitled "THREE DIMENSIONAL STACKED NONVOLATILE SEMICONDUCTOR MEMORY," no U.S. Pat. No. 7,852,675; U.S. patent application Ser. No. 12/679,991, filed on Mar. 25, 2010 and entitled "NONVOLATILE SEMICONDUCTOR STORAGE DEVICE AND METHOD OF MANUFACTURING THE SAME," now U.S. Pat. No. 8,372,720; and U.S. patent application Ser. No. 12/532,030, filed on Mar. 23, 2009 and entitled "SEMICONDUCTOR MEMORY AND METHOD FOR MANUFACTURING SAME," now abandoned. The entire contents of the above applications are incorporated herein by reference.

1. 1. 3 Mounting of I/F Chip and NAND Flash Memory

Figure 2:
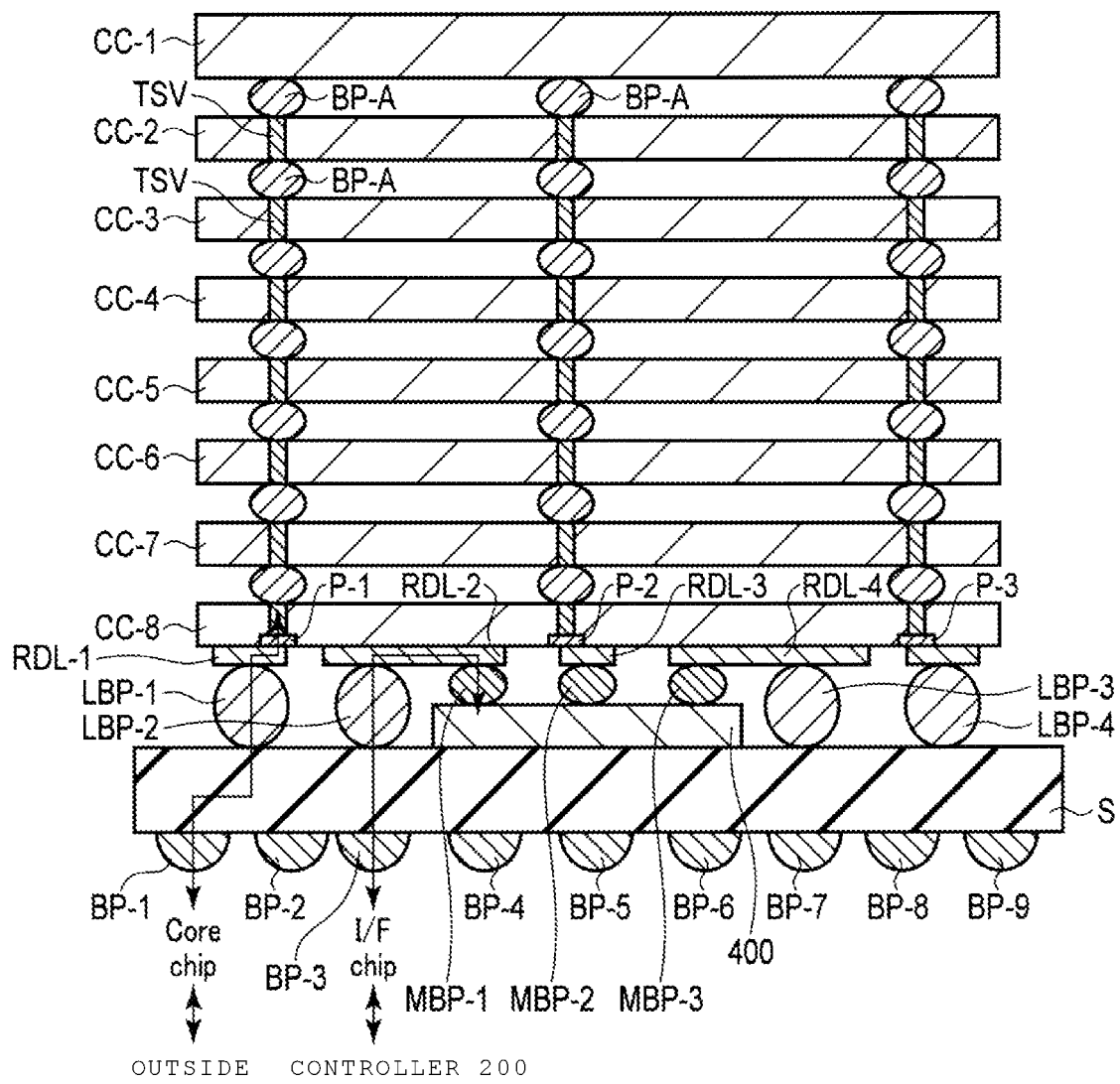
FIG. 2 is a sectional view illustrating the semiconductor device according to the first embodiment.

FIG. 2 is a sectional view illustrating a method of mounting the I/F chip 400 and the NAND flash memory 100 in the first embodiment. FIG. 1 illustrates a case of (N+1) of NAND flash memory 100. FIG. 2 illustrates a semiconductor device in which one NAND flash memory 100 is mounted in each of eight core chips CC-1 to CC-8 (N=7).

As illustrated in FIG. 2, the I/F chip 400 is mounted on a mounting substrate S. A plurality of large bumps LBP (LBP-1 to LBP-4) are formed on an upper surface of the mounting substrate S. A plurality of micro-bumps MBP (MBP-1 to MBP-3) are formed on an upper surface of the I/F chip 400. The large bumps LBP and the micro-bumps MBP are formed so as to cause a height from the upper surface of the substrate S to be the same in order to stack a plurality of core chips CC (CC-1 to CC-8) thereabove.

A plurality of bumps BP (BP-1 to BP-9) are formed on a lower surface of the substrate S. The bumps BP are electrically connected to the large bump LBP via an interconnection formed in the substrate S. The bump BP is used transmitting and receiving an input or output signal to and from the outside of the substrate S. In the first embodiment, for example, the bump BP-1 is used for power and the like supplied to each of the core chips CC-1 to CC-8. The bumps BP-2 to BP-9 are used for the input or output signal I/O which is transferred between the controller 200 and the I/F chip 400.

The plurality of core chips CC (CC-1 to CC-8) are stacked on the large bumps LBP and the micro-bumps MBP. The core chips CC-1 to CC-8 are electrically connected to each other via a bump BP-A and an electrode (TSV) which penetrates the chips. Such a structure is a package type structure which is referred to as a ball grid array (BGA) and has many I/O pins for input and output.

FIG. 2 illustrates only the bumps BP-1 to BP-9, the large bumps LBP-1 to LBP-4, and the micro-bumps MBP-1 to MBP-4. However, a bump BP, a large bump LBP, and a micro-bump MBP which are used for other I/O signals and the like and are not illustrated, are provided on the mounting substrate S.

According to the example in FIG. 2, the core chips CC-2 to CC-8 are mounted on the mounting substrate in a face-up manner. The core chip CC-1 on the top layer is mounted on the core chip CC-2 in a face-down manner. The NAND flash memory 100 described with reference to FIG. 1 is formed in each of the core chips CC (CC-1 to CC-8). The core chips CC-2 to CC-8 may be mounted on the mounting substrate in a face-down manner.

Interconnection layers RDL (RDL-1 to RDL-4 and interconnection layer RDL (not illustrated)) are formed on a lower surface of the core chip CC-8 that is at the bottom layer. The interconnection layer RDL electrically connects the large bump LBP formed on the substrate S to the TSV via a pad P. The interconnection layer RDL electrically connects the large bump LBP formed on the substrate S to the micro-bump MBP.

Specifically, for example, the bump BP-1 is electrically connected to TSV via the interconnection in the substrate S, the large bump LBP-1, the interconnection layer RDL-1, and a pad P-1. For example, the bump BP-3 is electrically connected to the I/F chip 400 via the interconnection in the substrate S, the large bump LBP-2, the interconnection layer RDL-2, and the micro-bump MBP-1. For example, the I/F chip 400 is electrically connected to each of the core chips CC via the micro-bump MBP-2, the interconnection layer RDL-3, a pad P-2, and the TSV.

The TSV is formed to penetrate the core chips CC-2 to CC-8. A TSV in each of the core chips CC-2 to CC-8 is provided in order to cause the core chip to be electrically connected to another core chip CC on an upper layer and/or a lower layer. The core chip CC-1 is mounted in a face-down manner. Thus, the TSV is not formed in the core chip CC-1. The NAND flash memory 100 formed in the core chip CC-1 is electrically connected to a TSV in the core chip CC-2 via the bump BP-A. A TSV in each of the core chips CC-2 to CC-8 is electrically connected to a TSV in another core chip CC on an upper layer and/or a lower layer via the bump BP-A.

1. 1. 4 Configuration of I/F Chip

Next, a configuration of the I/F chip will be described with reference to FIG. 3.

Figure 3:
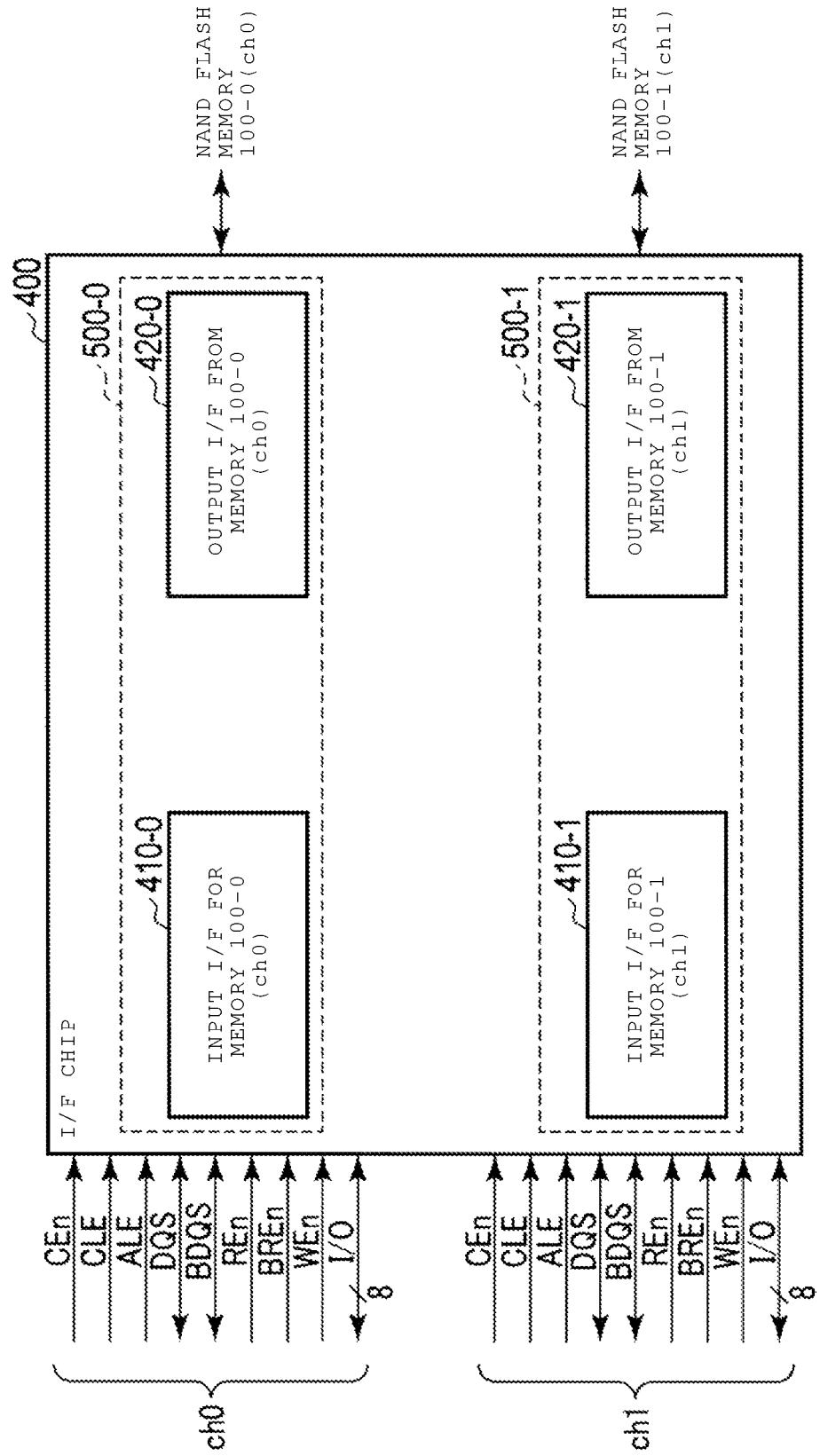
FIG. 3 is a block diagram illustrating an interface chip in the semiconductor device according to the first embodiment.

As illustrated in FIG. 3, the I/F chip 400 includes an I/F circuit 500 for each channel. In the first embodiment, each of the plurality of NAND flash memory 100-0 to 100-N is connected to either of the channel ch0 and the channel ch1. Thus, the controller 200 can simultaneously access the plurality of NAND flash memory 100 via the two channels ch0 and ch1.

An I/F circuit 500-0 for the channel ch0 includes an input I/F 410-0 and an output I/F 420-0. The input I/F 410-0 is used for inputting the signal I/O and the like from the controller 200 to the NAND flash memory 100 connected to the channel ch0. The output I/F 420-0 is used for outputting the signal I/O and the like from the NAND flash memory 100 connected to the channel ch0 to the controller 200.

Similarly, an I/F circuit 500-1 for the channel ch1 includes an input I/F 410-1 and an output I/F 420-1. The input I/F 410-1 is used for inputting the signal I/O and the like from the controller 200 to the NAND flash memory 100 for the channel ch1. The output I/F 420-1 is used for outputting the signal I/O and the like from the NAND flash memory 100 connected to the channel ch1 to the controller 200.

The input I/F 410-0 is an interface for linking signals (CEn, ALE, CLE, WEn, REn, BREn, I/O, DQS, and BDQS) input to the channel ch0 from the controller 200, to the NAND flash memory 100 for the corresponding channel ch0.

The input I/F 410-1 is an interface for linking signals (CEn, ALE, CLE, WEn, REn, BREn, I/O, DQS, and BDQS) input to the channel ch1 from the controller 200, to the NAND flash memory 100 for the corresponding channel ch1.

The output I/F 420-0 is an interface for linking data (signal I/O) output from the NAND flash memory 100 for the channel ch0, to the channel ch0 of the controller 200.

The output I/F 420-1 is an interface for linking data (signal I/O) output from the NAND flash memory 100 for the channel ch1, to the channel ch1 of the controller 200.

1. 1. 5 Configuration of Input I/F in IF Chip

Figure 4:
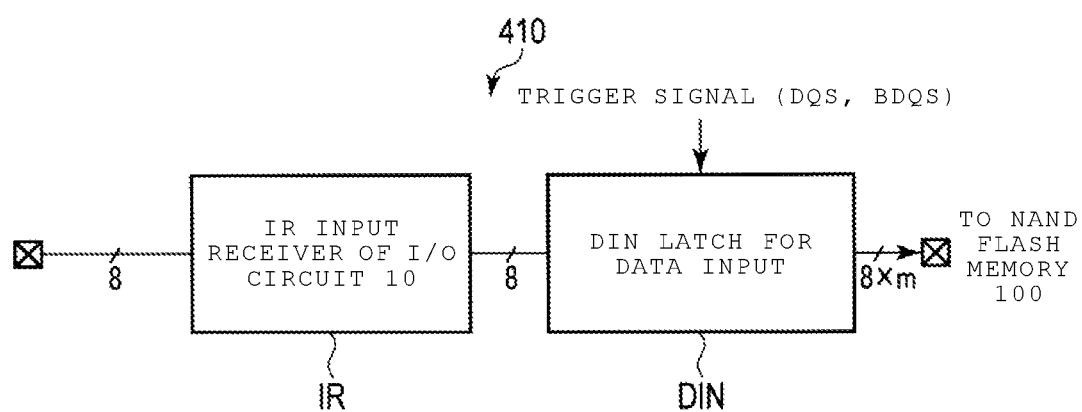
FIG. 4 is a block diagram illustrating a data input circuit in the interface chip in the semiconductor device according to the first embodiment.

Next, a configuration of the input I/F 410 in the I/F chip 400 will be described with reference to FIG. 4. FIG. 4 illustrates a circuit configuration of one input I/F 410.

As illustrated in FIG. 4, the input I/F 410 includes an input receiver IR for receiving an input signal I/O, and a latch circuit for data input DIN (simply described as "a latch DIN" below). For example, the input receiver IR and the latch DIN are provided for each terminal for the signal I/O. A signal I/O (for example, write data) input from each terminal (pad) is stored in the latch DIN via the input receiver IR.

The latch DIN latches an input signal I/O by using the signals DQS and BDQS which are sent from the controller 200, as a trigger. In the following descriptions, a period when a change of an input signal I/O is inhibited before the logical levels of the signals DQS and BDQS are inverted is referred to as "a set-up period", and a period when the change of an input signal I/O is inhibited after the logical levels of the signals DQS and BDQS are inverted is referred to as "a holding period". In the latch DIN, reducing the set-up period/holding period is required for improving a processing speed. Data latched by the latch DIN is output to the NAND flash memory 100 which is selected by address selection. For example, data having 8×m bits (m is any integer) is output to the NAND flash memory 100.

1. 1. 6 Configuration of Latch Circuit for Data Input

Next, a configuration of the latch circuit DIN for data input will be described with reference to FIG. 5. In the example in FIG. 5, a case where an input signal (data) I/O is latched at a timing when the signal DQS falls and the signal BDQS rises will be described. In the following descriptions, one of a source and a drain of a transistor is referred to as "one end of a current path", and the other of the source and the drain is referred to as "the other end of the current path". A case where the logical level of a signal (and node) is inverted (inverted from an "H" level to an "L" level or inverted from an "L" level to an "H" level) is referred to as "transitioning". A timing at which the potential of a signal (and node) starts to rise or fall by the transition is referred to as "a transition start". Further, a raising speed or a dropping speed of the potential when the transition of the logical level of the signal occurs is referred to as "a transition speed". A case where the transition speed is fast is referred to as a phase of "a slope of transition being steep".

Figure 5:
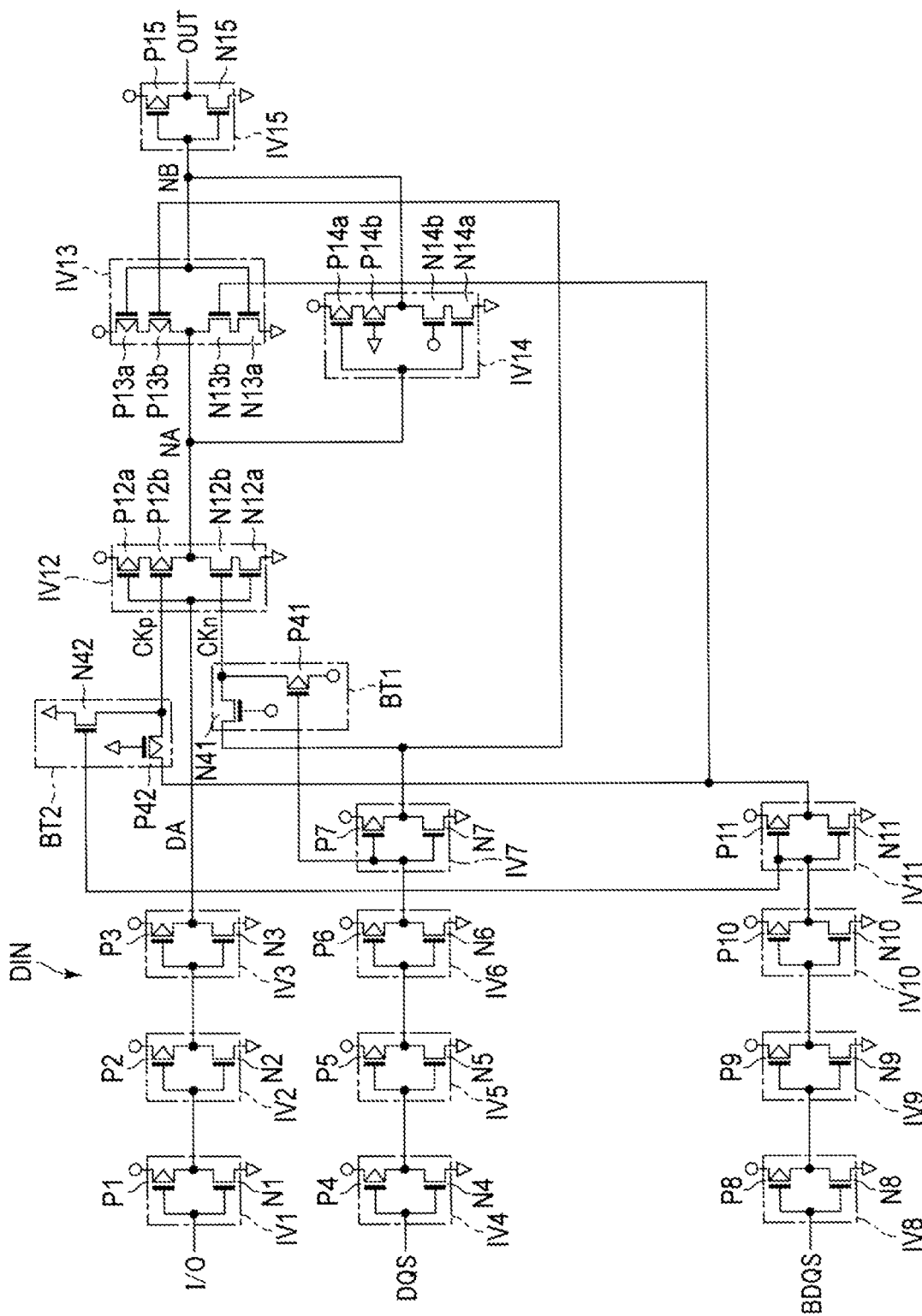
FIG. 5 is a circuit diagram illustrating a latch circuit for data input in the semiconductor device according to the first embodiment.

As illustrated in FIG. 5, the latch DIN includes inverters IV1 to IV15 and BT circuits BT1 and BT2.

The inverters IV1 to IV3 are connected in series. An input signal I/O is input to an input terminal of the inverter IV1. An output terminal of the inverter IV3 is connected to an input terminal of the inverter IV12. An inversion signal DA of the input signal I/O, which is delayed by the inverter IV1 to IV3 which constitute three stages is input to the inverter IV12. The inverters IV1 to IV3 function as a delay circuit configured to generate an inversion delay signal DA of an input signal I/O. The inverter IV1 includes a p-channel MOS transistor (or also described as a PMOS transistor) P1 and an N-channel MOS transistor (or also described as an NMOS transistor) N1. A gate of the transistor P1 is connected to the input terminal of the inverter IV1 and a gate of the transistor N1. A source of the transistor P1 is connected to a power-supply voltage terminal. A drain of the transistor P1 is connected to the output terminal of the inverter IV1 and a drain of the transistor N1. The source of the transistor N1 is grounded. The inverters IV2 and IV3 have a configuration similar to that of the inverter IV1. The inverter IV2 includes transistors P2 and N2. The inverter IV3 includes transistors P3 and N3. Although the three inverters IV1 to IV3 are connected in series, the number of inverters which are connected in series may be changed so long as the logical level of the signal DA is not inverted (in this case, the number may be an odd number).

The inverters IV4 to IV6 are connected in series. The signal DQS is input to an input terminal of the inverter IV4. An inversion delay clock signal of the signal DQS is output from an output terminal of the inverter IV6. The output terminal of the inverter IV6 is connected to an input terminal of the inverter IV7 and a gate of a p-channel MOS transistor P41 in the BT circuit BT1. The inverters IV4 to IV6 have a configuration similar to that of the inverter IV1. The inverter IV4 includes transistors P4 and N4. The inverter IV5 includes transistors P5 and N5. The inverter IV6 includes transistors P6 and N6. Although the three inverters IV4 to IV6 are connected in series, the number of inverters which are connected in series may be equal to any number of inverters in the inverter group connected to the input terminal of the input signal I/O.

An output terminal of the inverter IV7 is connected to a gate of a p-channel MOS transistor P13$b$ in the inverter IV13 and one end of a current path of an n-channel MOS transistor N41 in the BT circuit BT1. The inverter IV7 has a configuration similar to that of the inverter IV1 and includes transistors P7 and N7.

The BT circuit BT1 includes the n-channel MOS transistor N41 and the p-channel MOS transistor P41. A gate of the transistor N41 is connected to the power-supply voltage terminal. The other end of the current path is connected to a drain of the transistor P41 and a gate of an n channel MOS transistor N12$b$ in the inverter IV12. A source of the transistor P41 is connected to the power-supply voltage terminal. A clock signal based on the signal DQS input to the gate of the transistor N12$b$ is referred to as CKn below. In the BT circuit BT1, a waveform is shaped, when an output signal of the inverter IV7 (delay clock signal of the signal DQS) is transitioned from an "H" level to an "L" level, so as to generate the signal CKn.

More specifically, when the output signal of the inverter IV7 has an "H" level, the input signal to the inverter IV7 has a "L" level and so the transistor P41 is in an ON state. The transistor N41 is in a cutoff state because a power supply voltage is applied to the gate, the source, and the drain of the transistor N41. When the output signal of the inverter IV7 is transitioned from an "H" level to an "L" level, the transistor N41 is not in an ON state until the voltage of the output signal of the inverter IV7 reaches a voltage which is equal to or lower than ((power supply voltage)-(threshold voltage Vtn of the transistor N41)). Therefore, the transition start of the signal CKn is delayed relative to a transition start of the output signal of the inverter IV7 by a period that is correlated to a threshold voltage which is larger than the threshold voltage Vtn of the transistor N41. Thus, the signal CKn falls to the "L" level faster than that in the output signal of the inverter IV7. That is, the transistor N41 functions as a barrier transistor for causing the start of the signal CKn falling to be delayed and causing the slope of the transition to be steep.

Accordingly, the inverters IV4 to IV7 and the BT circuit BT1 function as a generation circuit of the signal CKn.

The inverters IV8 to IV10 are connected in series. The signal BDQS is input to an input terminal of the inverter IV8. An inversion delay clock signal of the signal BDQS is output from an output terminal of the inverter IV10. An output terminal of the inverter IV10 is connected to an input terminal of the inverter IV11 and a gate of an n-channel MOS transistor N42 in the BT circuit BT2. The inverters IV8 to IV10 have a configuration similar to that of the inverter IV1. The inverter IV8 includes transistors P8 and N8. The inverter IV9 includes transistors P9 and N9. The inverter IV10 includes transistors P10 and N10. Although the three inverters IV8 to IV10 are connected in series, the number of inverters which are connected in series may be equal to any number of inverters in the inverter group connected to the input terminal of the input signal I/O.

An output terminal of the inverter IV11 is connected to a gate of an n-channel MOS transistor N13$b$ in the inverter IV13 and one end of a current path of a p-channel MOS transistor P42 in the BT circuit BT2. The inverter IV11 has a configuration similar to that of the inverter IV1 and includes transistors P11 and N11.

The BT circuit BT2 includes an n-channel MOS transistor N42 and a p-channel MOS transistor P42. A gate of the transistor P42 is grounded. The other end of the current path is connected to a drain of the transistor N42 and a gate of a p channel MOS transistor P12$b$ in the inverter IV12. The source of the transistor N42 is grounded. A clock signal based on the signal BDQS input to the gate of the transistor P12$b$ is referred to as CKp below. When an output signal of the inverter IV11 (delay clock signal of the signal BDQS) is transitioned from an "L" level to an "H" level, in the BT circuit BT2, a waveform of the output signal of the inverter IV11 is shaped so as to generate the signal CKp.

More specifically, when the output signal of the inverter IV11 has an "L" level, the input signal to the inverter IV11 has a "H" level and so the transistor N42 is in an ON state. The transistor P42 is in a cutoff state because a ground voltage is applied to the gate, the source, and the drain of the transistor P42. When the output signal of the inverter IV11 is transitioned from an "L" level to an "H" level, the transistor P42 is not in an ON state until the voltage of the output signal of the inverter IV11 reaches a voltage which is equal to or higher than a threshold voltage Vtp of the transistor P42. Therefore, the transition start of the signal CKp is delayed relative to a transition start of the output signal of the inverter IV11 by a period that is correlated to a threshold voltage which is larger than the threshold voltage Vtp of the transistor P42. Thus, the signal CKp rises to the "H" level faster than that in the output signal of the inverter IV11. That is, the transistor P42 functions as a barrier transistor for causing a start of the signal CKp rising to be delayed and causing a slope of the transition to be steep.

Accordingly, the inverters IV8 to IV11 and the BT circuit BT2 function as a generation circuit of the signal CKp.

An output terminal of the inverter IV12 is connected to an output terminal of the inverter IV13 and an input terminal of the inverter IV14 via the node NA. The inverter IV12 is a clocked inverter configured to invert a signal DA in accordance with timings of the signals CKp and CKn. More specifically, for example, in a case where the signal CKp has an "L" level and the signal CKn has an "H" level, the inverter IV12 outputs an inversion signal of the signal DA to the node NA. The inverter IV12 includes p channel MOS transistors P12a and P12b and n channel MOS transistors N12a and N12b. A gate of the transistor P12a is connected to the input terminal of the inverter IV12 and a gate of the transistor N12a. A source of the transistor P12a is connected to the power-supply voltage terminal. A drain of the transistor P12a is connected to a source of the transistor P12b. A drain of the transistor P12b is connected to the output terminal of the inverter IV12 and a drain of the transistor N12b. A source of the transistor N12a is grounded. A drain of the transistor N12a is connected to a source of the transistor N12b.

An input terminal of the inverter IV13 is connected to an output terminal of the inverter IV14 and an input terminal of the inverter IV15 via the node NB. The inverter IV13 is a clocked inverter configured to invert data at the node NB in accordance with timings of the output signals of the inverters IV7 and IV11. More specifically, for example, in a case where the output signal of the inverter IV7 has an "L" level, and the output signal of the inverter IV11 has an "H" level, the inverter IV13 outputs an inversion signal at the node NB to the node NA. The inverter IV13 has a configuration similar to that of the inverter IV12, and includes transistors P13a, P13b, N13a, and N13b.

The inverter IV14 has a configuration similar to that of the inverter IV12, and includes transistors P14a, P14b, N14a, and N14b. A gate of the transistor P14b is grounded. A gate of the transistor N14b is connected to the power-supply voltage terminal. The inverters IV13 and IV14 constitute a latch circuit, and thus inversion data of the node NA is held at the node NB.

The inverter IV15 outputs inversion data of the node NB to the outside of the latch DIN. The inverter IV15 has a configuration similar to that of the inverter IV1, and includes transistors P15 and N15.

1. 2 Specific Example of Operation of Latch Circuit for Data Input

Next, a specific example of an operation of the latch circuit for data input DIN will be described with reference to FIG. 6. In the example in FIG. 6, a case where, when a period from an input of a signal I/O until the logical levels of the signals DQS and BDQS are inverted is substantially equal to or slightly longer than the set-up period, the signal DA is transitioned from an "L" level to an "H" level and data having an "L" level is latched at the node NA is shown.

At a time point t1, the latch DIN starts transition of the logical level of the signal DA. The signal DA is transitioned from an "L" level to an "H" level.

At a time point t2, the latch DIN starts transition of the logical level (potential) of the node NA. The signal at the node NA is transitioned from an "H" level to an "L" level. More specifically, since the signal CKp has an "L" level and the signal CKn has an "H" level, the transistors P12b and N12b in the inverter IV12 are an ON state. In this state, if the signal DA is transitioned from an "L" level to an "H" level, the inverter IV12 starts discharging at the node NA when the potential of the signal DA exceeds the threshold voltage of the transistor N12a. That is, a period of the time points t1 to t2 is a delay period by the inverter IV12.

At a time point t3, transition of the output signals of the inverters IV7 and IV11 is started. More specifically, the output signal of the inverter IV7 is transitioned from an "H" level to an "L" level, and the output signal of the inverter IV11 is transitioned from an "L" level to an "H" level.

At a time point t4, if the potential of a gate of the transistor P13b in the inverter IV13, that is, the potential of the output signal of the inverter IV7 is decreased to a voltage which is lower than (power supply voltage-threshold voltage Vtp), and the potential of the gate of the transistor N13b in the inverter IV13, that is, the potential of the output signal of the inverter IV11 is increased to a voltage which is higher than the threshold voltage Vtn, the transistors P13b and N13b in the inverter IV13 are in an ON state. The inverter IV13 outputs an inversion signal of the node NB, that is, a signal having an "H" level, to the node NA.

At a time point t5, the transistor N41 of the BT circuit BT1 and the transistor P42 of the BT circuit BT2 go into an ON state. Thus, the signal CKp is rapidly transitioned from an "L" level to an "H" level, and the signal CKn is rapidly transitioned from an "H" level to an "L" level. In the inverter IV12, the transistors P12b and N12b go into an OFF state in accordance with the signals CKp and CKn. Thus, discharging at the node NA is ended. Accordingly, a period of the time points t2 to t5 is a discharging period of the node NA in the inverter IV12. At this time, if the potential at the node NA is smaller than an inversion level at the node NB in the inverter IV14, the potential at the node NB is inverted from an "L" level to an "H" level. Thus, the signal having an "L" level is held at the node NA, and the signal having an "H" level is held at the node NB.

In a case where the signal DA is transitioned from an "H" level to an "L" level, the period of the time points t2 to t5 functions as the charging period of the node NA.

1. 3 Effects according to First Embodiment

With the configuration according to the first embodiment, it is possible to improve processing speed. The effect will be described below by using a comparative example.

First, the comparative example will be described with reference to FIGS. 7 and 8.

Figure 7:
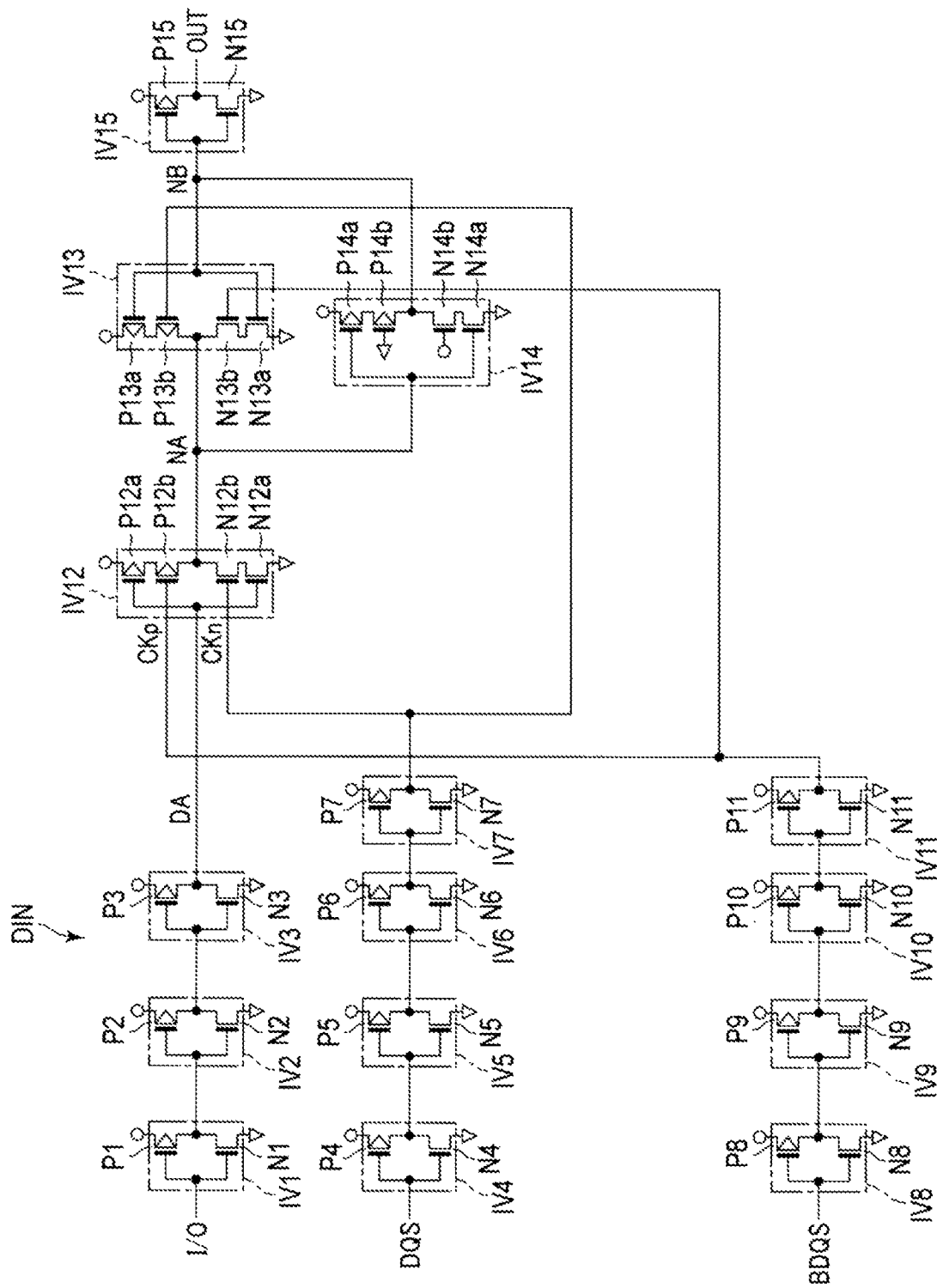
FIG. 7 is a circuit diagram illustrating a latch circuit for data input according to a comparative example.

FIG. 7 illustrates an example of a latch circuit for data input according to the comparative example. In the example in FIG. 7, the BT circuits BT1 and BT2 which are described in FIG. 5 in the first embodiment are not provided.

As illustrated in FIG. 7, the output signal of the inverter IV11 is input as the signal CKp, to the gate of the transistor P12b of the inverter IV12. The output signal of the inverter IV7 is input as the signal CKn, to the gate of the transistor N12b. Other components are the same as those in FIG. 5 in the first embodiment.

Figure 8:
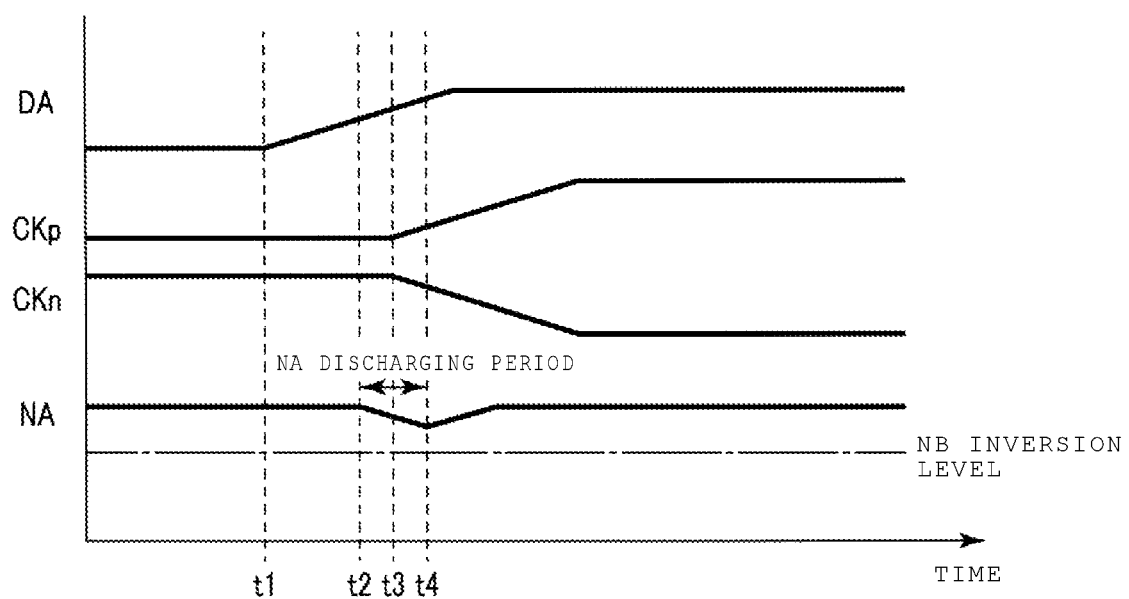
FIG. 8 is a timing chart illustrating various signals and a potential of a node in the latch circuit for data input according to the comparative example.

Next, FIG. 8 illustrates a specific example of an operation in the latch circuit for data input, which is illustrated in FIG. 7. In the example in FIG. 8, a case where the length of a period from an input of the signal I/O until the logical levels of the signals DQS and BDQS are inverted is equal to that in FIG. 6 is shown.

As illustrated in FIG. 8, at a time point t1, transition of the signal DA which is an inversion delay signal of the signal I/O is started. The signal DA is transitioned from an "L" level to an "H" level. At a time point t2, the signal CKp which is a signal obtained by delaying the signal BDQS has an "L" level, and the signal CKn which is a signal obtained by delaying the signal DQS has an "H" level. Thus, discharging at the node NA is started. Then, at a time point t3, transition of the signal CKp and the signal CKn, that is, the output signals of the inverters IV7 and IV11, is started. After the transition has started, the transistor N12b (and P12b) in the inverter IV12 goes into an OFF state at a time point t4, and discharging at the node NA is ended. In this case, the potential at the node NA is not decreased to a level which is smaller than the inversion level at the node NB. Thus, an "H" level is continuously held at the node NA and an "L" level as inversion data of the signal DA is not latched.

Figure 6:
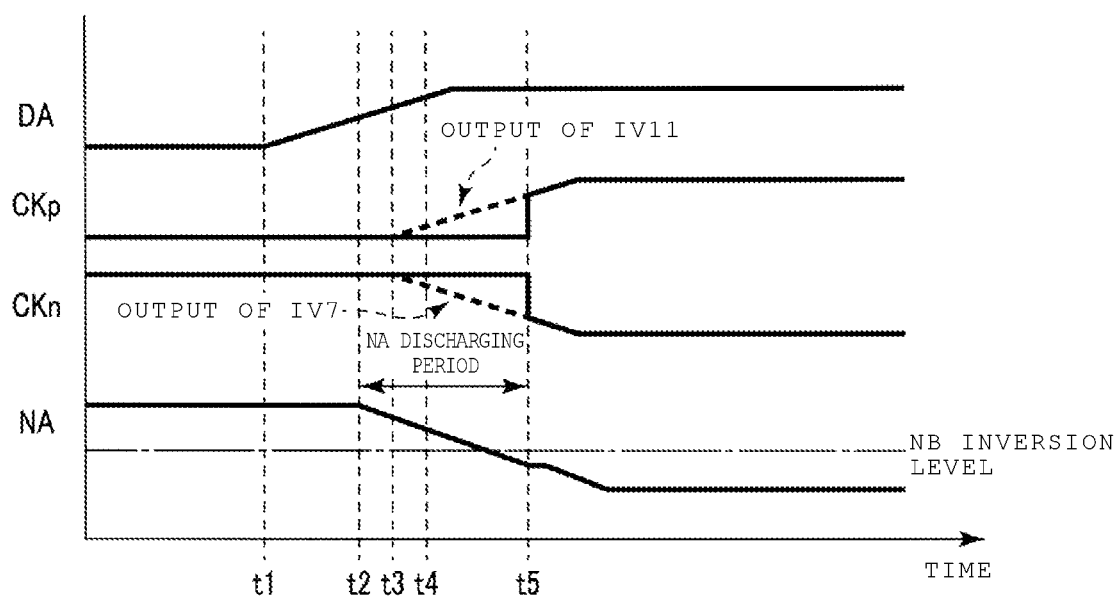
FIG. 6 is a timing chart illustrating various signals and a potential of a node in the latch circuit for data input in the semiconductor device according to the first embodiment.

That is, in the latch circuit for data input illustrated in FIG. 7, in a case where the length of the period from an input of the signal I/O until the logical levels of the signals DQS and BDQS are inverted is equal to that in FIG. 6, a period from a transition start of the signal DA to a transition start of the signals CKp and CKn is shorter than that in FIG. 6. Thus, the discharging period at the node NA is reduced in the inverter IV12. Thus, it may not be possible to properly latch the signal DA (input signal I/O).

Accordingly, in a case using the latch circuit for data input illustrated in FIG. 7, it is necessary that the period from an input of the signal I/O until the logical levels of the signals DQS and BDQS are inverted needs to be increased (the set-up period is increased), in order to sufficiently secure the length of the period from the transition start of the signal DA to the transition start of the signals CKp and CKn. Therefore, adjustment is required so as to delay the signal DQS and the signal BDQS relative to the input signal I/O. In a case where a new delay circuit for the signals DQS and BDQS is provided, a delay period between data (input signal I/O) and the clock (signals DQS and BDQS) depends on a circuit which is different from the latch DIN. Thus, the delay period varies depending on variation in manufacturing (process) of a semiconductor device, variation in a voltage, or dependency of an operation temperature (temperature) (referred to as "PVT dependency" below). Consequently, the set-up period/holding period is required to be increased more. If the set-up period/holding period becomes longer, it is not possible to increase the speed of data reception in the input I/F. Thus, the processing speed of a semiconductor device is lowered.

On the contrary, the BT circuits BT1 and BT2 are provided in the configuration according to the first embodiment. Thus, it is possible to shape a waveform of the signals CKp and CKn. More specifically, in the BT circuit, it is possible to output a signal which has a delayed transition start of the logical level and has rapid transition (change of the potential) of the logical level (fast transition speed) in comparison to those of an input signal (for example, output signals of the inverters IV7 and IV11). Thus, in the inverter IV12, when discharging (or charging) at the node NA is performed, it is possible to secure the discharging (or charging) period for inverting the logical level at the node NA so as to be increased in comparison to that in a case where the BT circuit is not provided. Accordingly, it is not necessary that the signals DQS and BDQS are unnecessarily delayed relative to the input signal I/O. Thus, it is possible to reduce PVT dependency on the set-up period/holding period. Further, it is possible to reduce a set-up period/holding period of the latch circuit DIN for data input, and to increase the speed of data reception in the input I/F 410. Thus, it is possible to improve the processing speed of a semiconductor device.

2. Second Embodiment

Next, a semiconductor device according to a second embodiment will be described. In the second embodiment, a configuration of a latch circuit for data input DIN which is different from that in the first embodiment will be described. Only points which are different from that in the first embodiment will be described below.

2. 1 Configuration of Latch Circuit for Data Input

A configuration of the latch circuit DIN for data input will be described with reference to FIG. 9.

Figure 9:
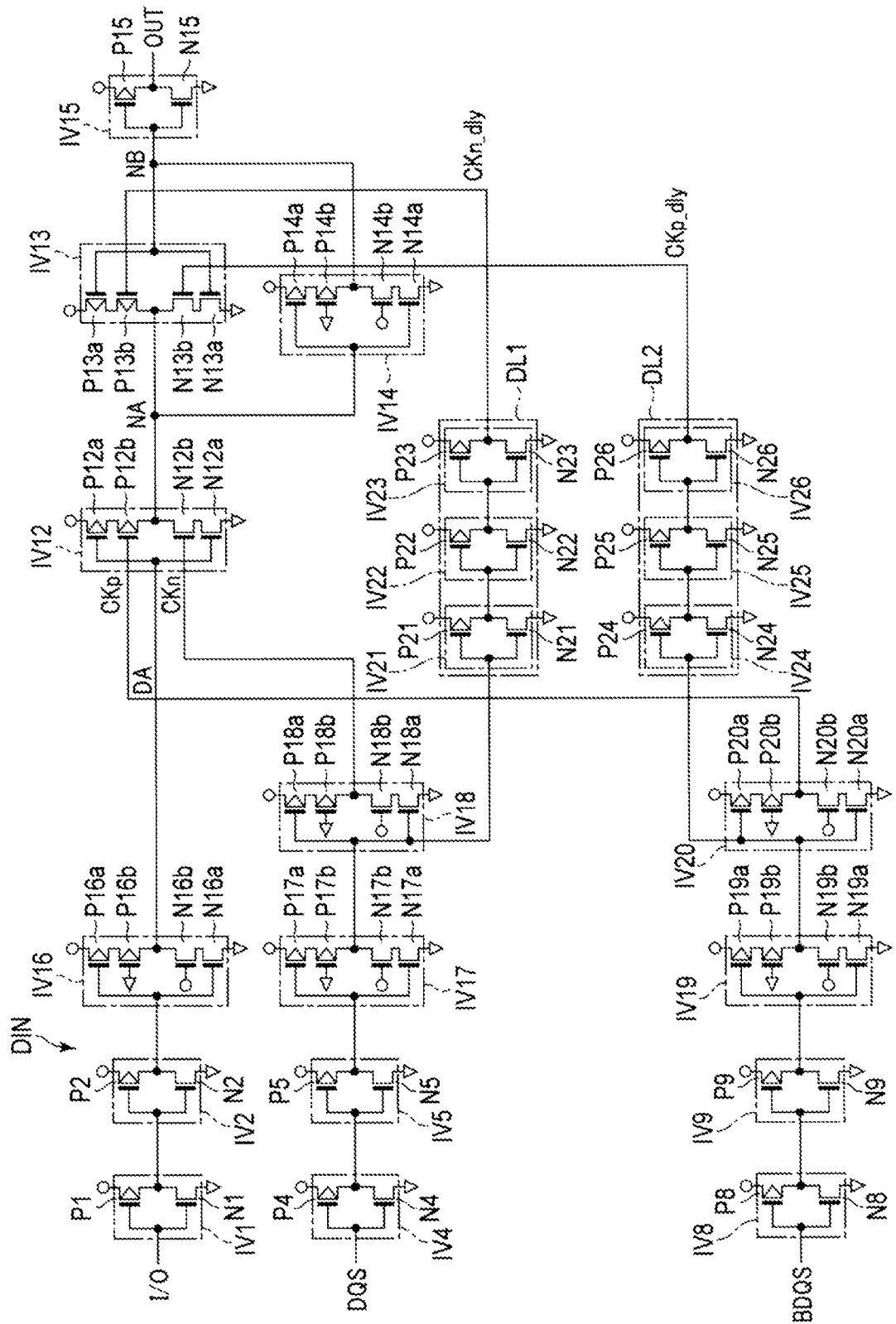
FIG. 9 is a circuit diagram illustrating a latch circuit for data input in a semiconductor device according to a second embodiment.

As illustrated in FIG. 9, the latch DIN includes inverters IV1, IV2, IV4, IV5, IV8, IV9, and IV12 to IV20, and delay circuits DL1 and DL2. The configuration of the inverters IV1, IV2, IV4, IV5, IV8, IV9, and IV12 to IV15 is the same as that in FIG. 5 in the first embodiment. In FIG. 9, the BT circuits BT1 and BT2 which are described with reference to FIG. 5 are removed. In FIG. 9, the inverters IV16 to IV20 having a configuration which is the same as that of the inverter IV14 are used instead of the inverters IV3, IV6, IV7, IV10, and IV11 illustrated in FIG. 5 in the first embodiment. However, similarly to the first embodiment, the inverters IV3, IV6, IV7, IV10, and IV11 may be used.

An output terminal of the delay circuit DL1 is connected to the gate of the transistor P13b in the inverter IV13. A signal (referred to as "a signal CKn_dly" below) obtained by delaying the signal DQS through the inverters IV4, IV5, and IV17 and the delay circuit DL1 is input to the gate of the transistor P13b. An output terminal of the delay circuit DL2 is connected to the gate of the transistor N13b. A signal (referred to as "a signal CKp_dly" below) obtained by delaying the signal BDQS through the inverters IV8, IV9, and IV19 and the delay circuit DL2 is input to the gate of the transistor N13b. The signals CKn_dly and CKp_dly are signals obtained in a manner that the signals CKn and CKp are delayed by two stages of the inverter.

An input terminal of the inverter IV16 is connected to the output terminal of the inverter IV2. An output terminal of the inverter IV16 is connected to an input terminal of the inverter IV12. The inverter IV16 has a configuration similar to that of the inverter IV14, and includes transistors P16a, P16b, N16a, and N16b.

An input terminal of the inverter IV17 is connected to the output terminal of the inverter IV5. An output terminal of the inverter IV17 is connected to an input terminal of the inverter IV18 and an input terminal of the delay circuit DL1. The inverter IV17 has a configuration similar to that of the inverter IV14, and includes transistors P17a, P17b, N17a, and N17b.

An output terminal of the inverter IV18 is connected to the gate of the transistor N12b in the inverter IV12. The inverter IV18 has a configuration similar to that of the inverter IV14, and includes transistors P18a, P18b, N18a, and N18b.

An input terminal of the inverter IV19 is connected to an output terminal of the inverter IV9. An output terminal of the inverter IV19 is connected to an input terminal of the inverter IV20 and an input terminal of the delay circuit DL2. The inverter IV19 has a configuration similar to that of the inverter IV14, and includes transistors P19a, P19b, N19a, and N19b.

An output terminal of the inverter IV20 is connected to the gate of the transistor P12b in the inverter IV12. The inverter IV20 has a configuration similar to that of the inverter IV14, and includes transistors P20a, P20b, N20a, and N20b.

The delay circuit DL1 includes inverters IV21 to IV23. The inverters IV21 to IV 23 are connected in series. An input terminal of the inverter IV21 is connected to the input terminal of the delay circuit DL1. An output terminal of the inverter IV23 is connected to an output terminal of the delay circuit DL1. The inverters IV21 to IV23 have a configuration similar to that of the inverter IV1. The inverter IV21 includes transistors P21 and N21. The inverter IV22 includes transistors P22 and N22. The inverter IV23 includes transistors P23 and N23.

Although the three inverters IV21 to IV23 are connected in series, the number of inverters which are connected in series may be changed so long as the logical level is not inverted. It is necessary that the signal CKn_dly is delayed relative to the signal CKn. Thus, the number of inverters may be any odd number which is equal to or greater than three. Further, in the second embodiment, the input terminal of the inverter IV21 is connected to the output terminal of the inverter IV17. However, the input terminal of the inverter IV21 may be connected to the output terminal of the inverter IV18. In this case, the number of inverters in the delay circuit DL1 may be any even number which is equal to or greater than two (for example, inverters IV21 and IV22), such that the logical level is not inverted.

Figure 10:
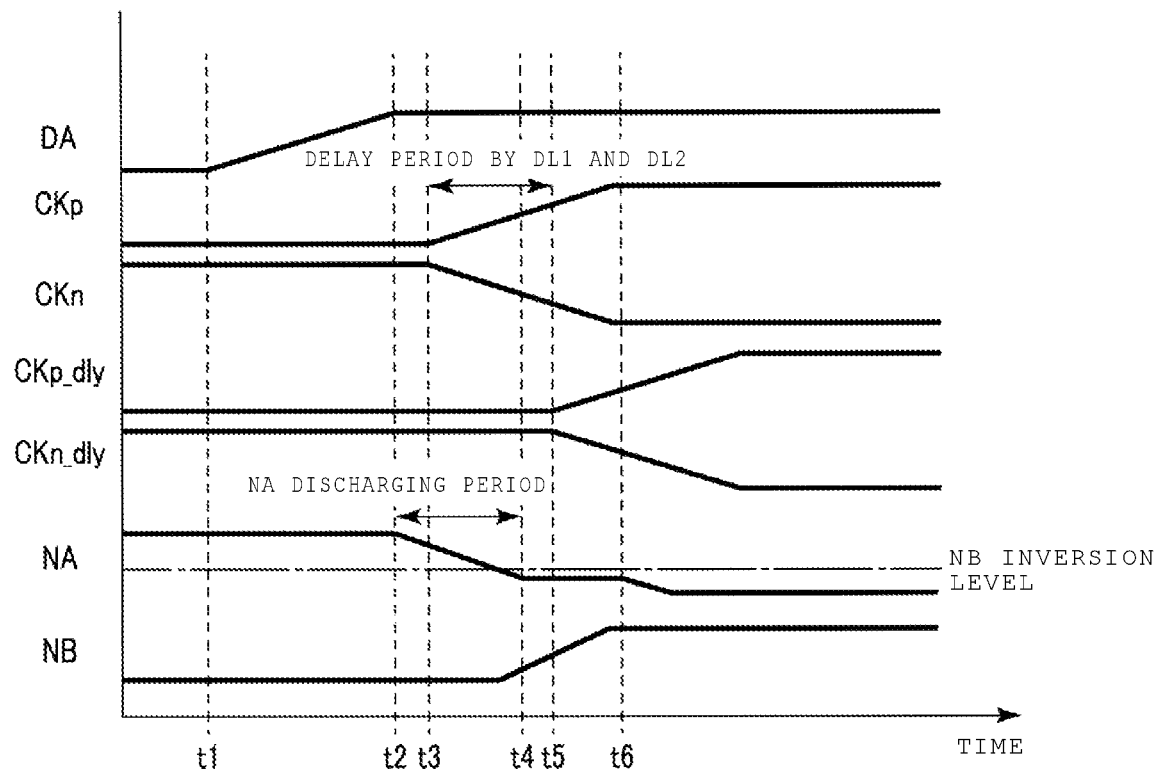
FIG. 10 is a timing chart illustrating various signals and potentials of two nodes in the latch circuit for data input in the semiconductor device according to the second embodiment.

The delay circuit DL2 includes inverters IV24 to IV26. The inverters IV24 to IV 26 are connected in series. An input terminal of the inverter IV24 is connected to an input terminal of the delay circuit DL2. An output terminal of the inverter IV26 is connected to an output terminal of the delay circuit DL2. The inverters IV24 to IV26 have a configuration similar to that of the inverter IV1. The inverter IV24 includes transistors P24 and N24. The inverter IV25 includes transistors P25 and N25. The inverter IV26 includes transistors P26 and N26. Although three inverters IV24 to IV26 are connected in series, the number of inverters which are connected in series may be any number equal to the number of inverters in the delay circuit DLL 2. 2 Specific Example of Operation of Latch Circuit for Data Input Next, a specific example of an operation of the latch circuit DIN for data input DIN will be described with reference to FIG. 10. In the example in FIG. 10, a case where data having an "L" level is latched at the node NA in a state where a period from an input of a signal I/O until the logical levels of the signals DQS and BDQS are inverted is substantially equal to or slightly longer than the set-up period is shown.

At a time point t1, the latch DIN starts transition of the logical level of the signal DA. The signal DA is transitioned from an "L" level to an "H" level.

At a time point t2, the latch DIN starts transition of the logical level at the node NA. The signal at the node NA is transitioned from an "H" level to an "L" level.

At a time point t3, transition of the logical levels of the signals CKp and CKn is started. More specifically, the signal CKp is transitioned from an "L" level to an "H" level, and the signal CKn is transitioned from an "H" level to an "L" level. If the potential at the node NA is smaller than an inversion level at the node NB, the inverter IV14 increases the potential at the node NB.

At a time point t4, the transistor N12b (and P12b) in the inverter IV12 goes into an OFF state, and discharging at the node NA is ended. Accordingly, a period of the time points t2 to t4 is a discharging period of the node NA in the inverter IV12.

At a time point t5, transition of the signals CKp_dly and CKn_dly is started. More specifically, the signal CKp_dly is transitioned from an "L" level to an "H" level, and the signal CKn_dly is transitioned from an "H" level to an "L" level. Accordingly, a period of the time points t3 to t5 is a delay period by the delay circuits DL1 and DL2.

At a time point t6, the transistors P13b and N13b of the inverter IV13 go into an ON state. Thus, the inverter IV13 outputs an inversion signal at the node NB, to the node NA. Accordingly, at the time point t6, the logical level of the latch circuit configured with the inverters IV13 and IV14 is determined. That is, since the signals CKp_dly and CKn_dly are respectively delayed relative to the signals CKp and CKn, it is possible to secure a sufficient period for increasing the potential at the node NB up to an "H" level. As a result, a signal having an "L" level is held at the node NA and a signal having an "H" level is held at the node NB.

2. 3 Effects According to Second Embodiment

With the configuration according to the second embodiment, it is possible to obtain an effect which is similar to that in the first embodiment. The effect will be described below by using a comparative example.

First, the comparative example will be described with reference to FIG. 11. In the example in FIG. 11, a specific example of an operation in the comparative example of the latch for data input illustrated in FIG. 7 is illustrated. The example in FIG. 11 shows a case where the length of the period from an input of the signal I/O until the logical levels of the signals DQS and BDQS are inverted is equal to that in FIG. 10.

Figure 11:
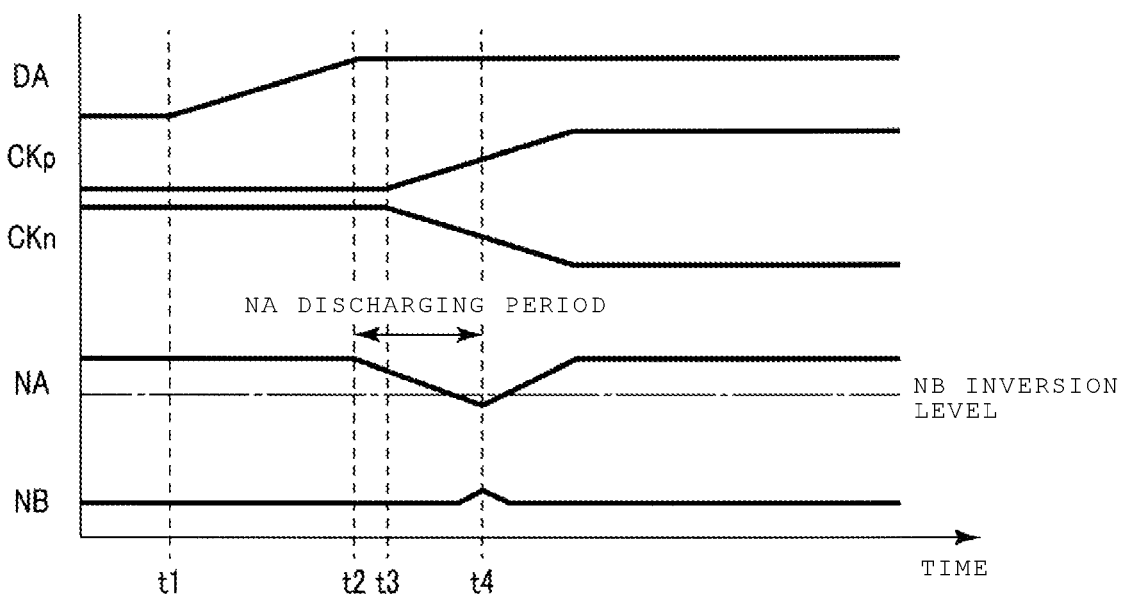
FIG. 11 is a timing chart illustrating various signals and potentials of two nodes in the comparative example.

As illustrated in FIG. 11, at a time point t1, transition of the logical level of the signal DA is started, and the signal DA is transitioned from an "L" level to an "H" level. After the transition has started, at a time point t2, the signal CKp has an "L" level and the signal CKn has an "H" level. Thus, discharging at the node NA is started. Then, at a time point t3, transition of the signal CKp and the signal CKn is started. After the transition has started, at a time point t4, the transistor N12b (and P12b) in the inverter IV12 goes into an OFF state, and discharging at the node NA is ended. The transistors N13b and P13b in the inverter IV13 go into an ON state. That is, the latch circuit configured with the inverters IV13 and IV14 is in a charge holding state. The inverter IV12 ends discharging at the node NA in a state where the level at the node NA is slightly lower than an inversion level at the node NB. The latch circuit configured with the inverters IV13 and IV14 is switched to the charge holding state. If the switching is performed, the potential at the node NB at the time point t4 is an "L" level (not increased up to an "H" level). Thus, the latch circuit operates so as to cause the potential at the node NA to be brought back to the "H" level again. Thus, the signal at the node NA is not inverted to an "L" level.

That is, in the latch circuit for data input illustrated in FIG. 7, an end of discharging at the node NA in the inverter IV12 (timing when the transistors N12b and P12b go into an OFF state) is performed at the substantially same timing as a timing when the inverter IV13 transitions to the charge holding state (timing when the transistors N13b and P13b go into an OFF state). Therefore, in a case where the length of the period from an input of the signal I/O until the logical levels of the signals DQS and BDQS are inverted is equal to that in FIG. 10, in the latch circuit for data input illustrated in FIG. 7, it is not possible to transition the logical level at the node NB by the inverter IV14. Thus, it may not be possible to properly latch the signal DA (input signal I/O).

Thus, in a case of using the latch for data input illustrated in FIG. 7, it is necessary that the set-up period/holding period is increased, in order to secure a transition period at the node NB. If the signals DQS and BDQS are delayed more in order to optimize the set-up period/holding period, the delay period varies by PVT dependency. Thus, it is necessary that the set-up period/holding period is increased more. If the set-up period/holding period becomes longer, it is not possible to increase the speed of data reception in the input I/F. Thus, the processing speed of a semiconductor device is lowered.

On the contrary, the delay circuits DL1 and DL2 are provided in the configuration according to the third embodiment. Thus, it is possible to delay the signals CKp_dly and CKn_dly input to the inverter IV13, relative to the signals CKp and CKn input to the inverter IV12. Thus, even in a case where the inverter IV12 ends discharging at the node NA in a state where the potential at the node NA is slightly lower than an inversion level at the node NB, it is possible to increase the potential at the node NB up to an "H" level during the delay period of the signals CKp_dly and CKn_dly. In addition, it is possible to invert the logical level at the node NA. Thus, it is possible to determine the set-up period/holding period only by using an input of the signal DA to the inverter IV12 and a timing of the signals CKp and CKn. Since adjustment of the delay period the signal DQS and the signal BDQS, it is possible to reduce the PVT dependency of the set-up period/holding period. Further, it is possible to reduce the set-up period/holding period of the latch circuit DIN for data input, and to increase the speed of data reception in the input I/F 410. Thus, it is possible to improve the processing speed of a semiconductor device.

3. Third Embodiment

Next, a semiconductor device according to a third embodiment will be described. In the third embodiment, a configuration of a latch circuit DIN for data input, which is different from the first and second embodiments will be described. Only points which are different from that in the first and second embodiments will be described below.

3. 1 Configuration of Latch Circuit for Data Input

The configuration of the latch circuit DIN for data input will be described with reference to FIG. 12.

Figure 12:
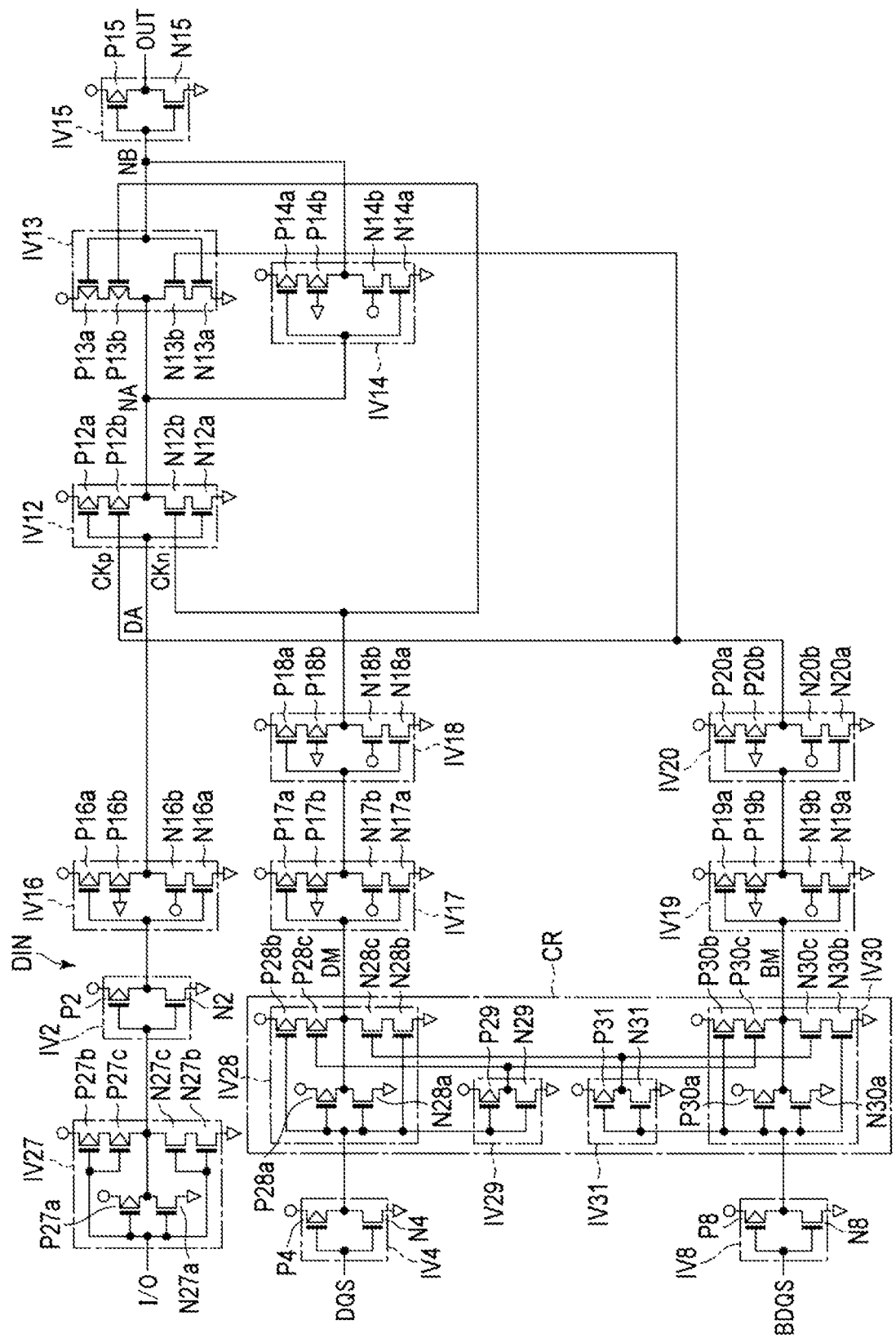
FIG. 12 is a circuit diagram illustrating a latch circuit for data input in a semiconductor device according to a third embodiment.

As illustrated in FIG. 12, the latch DIN includes inverters IV2, IV4, IV8, and IV12 to IV20, an inverter IV27, and a correction circuit CR (inverters IV28 to IV31). The configuration of the inverters IV2, IV4, IV8, and IV12 to IV20 is the same as that in FIG. 5 in the first embodiment and FIG. 9 in the second embodiment. In FIG. 12, the BT circuits BT1 and BT2 which are described with reference to FIG. 5, and the delay circuits DL1 and DL2 which are described with reference to FIG. 9 are not present.

An output terminal of the inverter IV18 is connected to the transistor N12b of the inverter IV12 and the transistor P13b of the inverter IV13. That is, the signal CKn is input to the gate of the transistor N12b and the gate of the transistor P13b.

An output terminal of the inverter IV20 is connected to the transistor P12b in the inverter IV12 and the transistor N13b in the inverter IV13. That is, the signal CKp is input to the gate of the transistor P12b and the gate of the transistor N13b.

The input signal I/O is input to an input terminal of the inverter IV27. An output terminal of the inverter IV27 is connected to the input terminal of the inverter IV2. The inverter IV27 includes p-channel MOS transistors P27a to P27c and N-channel MOS transistors N27a to N27c. A gate of the transistor P27a is connected to the input terminal of the inverter IV27 and a gate of each of the transistors P27b, P27c, and N27a to N27c. A source of the transistor P27a is connected to the power-supply voltage terminal. A drain of the transistor P27a is connected to the output terminal of the inverter IV27 and a drain of each of the transistors P27c, N27a, and N27c. A source of the transistor N27a is grounded. A source of the transistor P27b is connected to the power-supply voltage terminal, and a drain of the transistor P27b is connected to a source of the transistor P27c. A source of the transistor N27b is grounded, and a drain of the transistor N27b is connected to a source of the transistor N27c. The inverter IV27 also represents two inverters: an inverter including transistors P27a and N27a and an inverter including transistors P27b, P27c, N27b, and N27c. The inverter IN27 has a configuration similar to that of the inverters IV28 and IV30 so that an amount of delay from the input signal introduced by them can be made equal.

The correction circuit CR corrects variation of a duty ratio in the signals DQS and BDQS, that is, a difference (simply referred to as "an HL difference" below) of the length between a period of an "L" level and a period of an "H" level in the clock signal. The HL difference occurs in, for example, the input receiver IR. If the HL difference occurs, a timing when the logical level of the signal DQS is inverted is shifted from a timing when the logical level of the signal BDQS is inverted. If the HL difference is corrected by using the correction circuit CR and variation in timings of the signals CKp and CKn is reduced, for example, variation in the length of the transition period of the potential (logical level) at the node NA is reduced.

The correction circuit CR includes inverters IV28 to IV31. An input terminal of the inverter IV28 is connected to the output terminal of the inverter IV4 and an input terminal of the inverter IV29. An output terminal of the inverter IV28 is connected to the input terminal of the inverter IV17. A clock signal based on the signal DQS output from the inverter IV28 to the inverter IV17 is referred to as "DM" below. The inverter IV28 has a configuration similar to that of the inverter IV27, and includes transistors P28a to P28c and N28a to N28c. A gate of each of the transistors P28a, P28b, N28a, and N28b is connected to the input terminal of the inverter IV28. A gate of the transistor P28c is connected to an output terminal of the inverter IV29 and agate of the transistor P30c in the inverter IV30. A gate of the transistor N28c is connected to an output terminal of the inverter IV31 and a gate of the transistor N30c in the inverter IV30.

The inverter IV29 has a configuration similar to that of the inverter IV1, and includes transistors P29 and N29.

An input terminal of the inverter IV30 is connected to the output terminal of the inverter IV8 and an input terminal of the inverter IV31. An output terminal of the inverter IV30 is connected to the input terminal of the inverter IV19. A clock signal based on the signal BDQS output from the inverter IV30 to the inverter IV19 is referred to as "BM" below. The inverter IV30 has a configuration similar to that of the inverter IV28, and includes transistors P30a to P30c and N30a to N30c. A gate of each of the transistors P30a, P30b, N30a, and N30b is connected to an input terminal of the inverter IV30.

The inverter IV31 has a configuration similar to that of the inverter IV1, and includes transistors P31 and N31.

In the example in FIG. 12, the correction circuit CR that corrects a signal corresponding to the signal BDQS in a case where a period of an "L" level is shorter than a period of an "H" level is described. However, it is not limited thereto. For example, a correction circuit in which the connection of the output terminal of the inverter IV29 and the connection of the output terminal of the inverter IV31 are swapped and a signal corresponding to the signal DQS is corrected, may be provided. In addition, a correction circuit in which the position of the correction circuit CR and the position of the inverters IV17 and IV19 are swapped, and a signal is corrected in a case where a period of an "H" level is shorter than a period of an "L" level, may be provided. The correction circuit CR may be changed to any of the above correction circuits. A plurality of correction circuits may also be provided.

3. 2 Specific Example of Operation of Correction Circuit

Next, a specific example of an operation of the correction circuit CR will be described.

3. 2. 1 Case where Period of "L" Level is Short

First, a case where a period of an "L" level is shorter than a period of an "H" level will be described with reference to FIG. 13.

Figure 13:
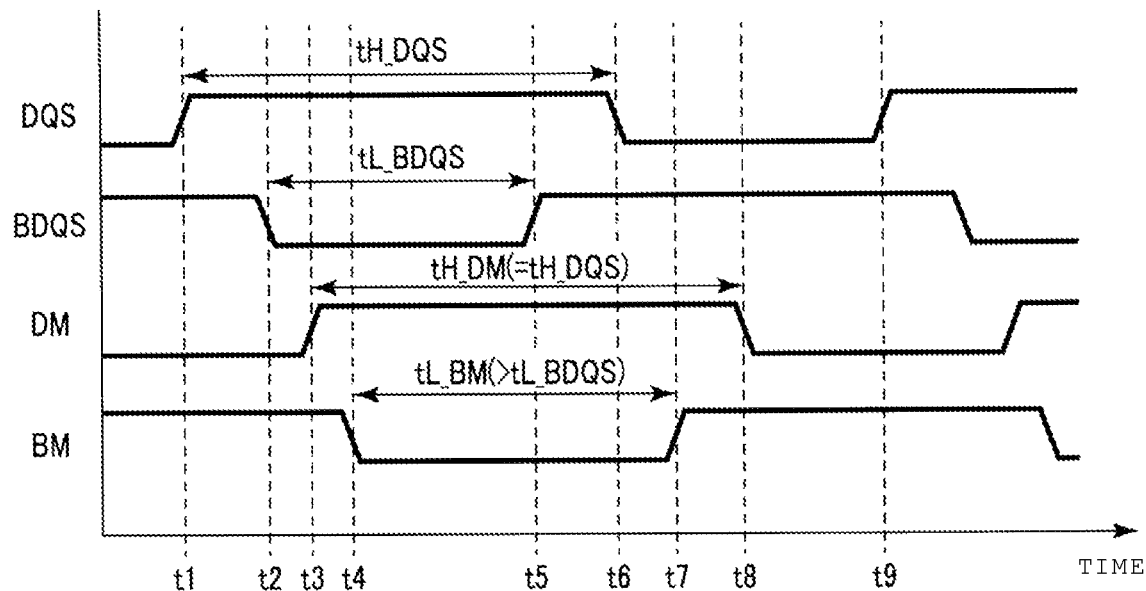
FIG. 13 is a timing chart illustrating various signals and potentials of two nodes in the latch circuit for data input in the semiconductor device according to the third embodiment.

As illustrated in FIG. 13, at a time point t1, the signal DQS is transitioned from an "L" level to an "H" level.

At a time point t2, the signal BDQS is transitioned from an "H" level to an "L" level. A period of the time points t1 to t2 corresponds to the HL difference.

At a time point t3, the correction circuit CR causes the signal DM to be transitioned from an "L" level to an "H" level. More specifically, the output signal of the inverter IV4 (inversion signal ("L" level) of the signal DQS) is input to the inverters IV28 and IV29. Thus, in the inverter IV28, the transistors P28a and P28b go into an ON state and the transistors N28a and N28b go into an OFF state. Since the inverter IV29 outputs a signal of an "H" level, the transistor P28c is in an OFF state. Further, since the inverter IV31 outputs a signal of an "H" level, the transistor N28c is in an ON state. Thus, an output of the inverter IV28 has an "H" level via the transistor P28a.

At a time point t4, the correction circuit CR causes the signal BM to be transitioned from an "H" level to an "L" level. More specifically, the output signal of the inverter IV8 (inversion signal ("H" level) of the signal BDQS) is input to the inverters IV30 and IV31. Thus, in the inverter IV30, the transistors P30a and P30b go into an OFF state and the transistors N30a and N30b go into an ON state. Since the inverter IV31 outputs a signal of an "L" level, the transistor N30c is in an OFF state. Further, since the inverter IV29 outputs a signal of an "H" level at the time point t3, the transistor P30c is in an OFF state. Thus, an output of the inverter IV30 has an "L" level via the transistor N30a.

At this time, since the transistor P30c goes into an OFF state at the time point t3, it can be considered that the inverter IV30 is configured with the transistors P30a and N30a to N30c. Therefore, a β ratio of the inverter IV30, that is, a ratio of β in the n-channel MOS transistor and β in the p-channel MOS transistor is changed. As a result, the duty ratio varies and a period of an "L" level in the signal BM becomes longer than that in the signal BDQS. Further, since the load of the p channel MOS transistor is reduced, the delay period by the inverter IV30 is reduced. Thus, a timing of the transition start of the signal BM becomes earlier than that in a case where the β ratio of the inverter IV30 is not changed.

At a time point t5, the signal BDQS is transitioned from an "L" level to an "H" level. A period of the time points t2 to t5 when the signal BDQS has an "L" level is described as "a period tL_BDQS" below.

At a time point t6, the signal DQS is transitioned from an "H" level to an "L" level. A period of the time points t1 to t6 when the signal DQS has an "H" level is described as "a period tH_DQS" below.

At a time point t7, the correction circuit CR causes the signal BM to be transitioned from an "L" level to an "H" level. More specifically, the output signal of the inverter IV8 (inversion signal ("L" level) of the signal BDQS) is input to the inverters IV30 and IV31. Thus, in the inverter IV30, the transistors P30a and P30b go into an ON state and the transistors N30a and N30b go into an OFF state. Since the inverter IV31 outputs a signal of an "H" level, the transistor N30c is in an ON state. Further, since the inverter IV29 outputs a signal of an "H" level, the transistor P30c is in an OFF state. Thus, an output of the inverter IV30 has an "H" level via the transistor P30a.

At this time, in the inverter IV30, similar to a case of the time point t4, a timing when the signal BM is transitioned form an "L" level to an "H" level is delayed by the change of the β ratio, in comparison to that in a case where the β ratio of the inverter IV30 is not changed.

Thus, a period (period tL_BM) of the time point t4 to the time point t7 when the signal BM has an "L" level becomes longer than the period tL_BDQS. Accordingly, the HL difference in the signal CKp is reduced.

At a time point t8, the correction circuit CR causes the signal DM to be transitioned from an "H" level to an "L" level. More specifically, the output signal of the inverter IV4 (inversion signal ("H" level) of the signal DQS) is input to the inverters IV28 and IV29. Thus, in the inverter IV28, the transistors P28a and P28b go into an OFF state and the transistors N28a and N28b go into an ON state. Since the inverter IV29 outputs a signal of an "L" level, the transistor P28c is in an ON state. Further, since the inverter IV31 outputs a signal of an "H" level, the transistor N28c is in an ON state. Thus, an output of the inverter IV28 has an "L" level via the transistors N28a to N28c. A period (period tH_DM) of the time point t3 to the time point t8 when the signal DM has an "H" level has substantially the same as that of the period tH_DQS.

3. 2. 2 Case where Period of "H" Level is Short

Next, a case where a period of an "H" level is shorter than a period of an "L" level will be described with reference to FIG. 14.

Figure 14:
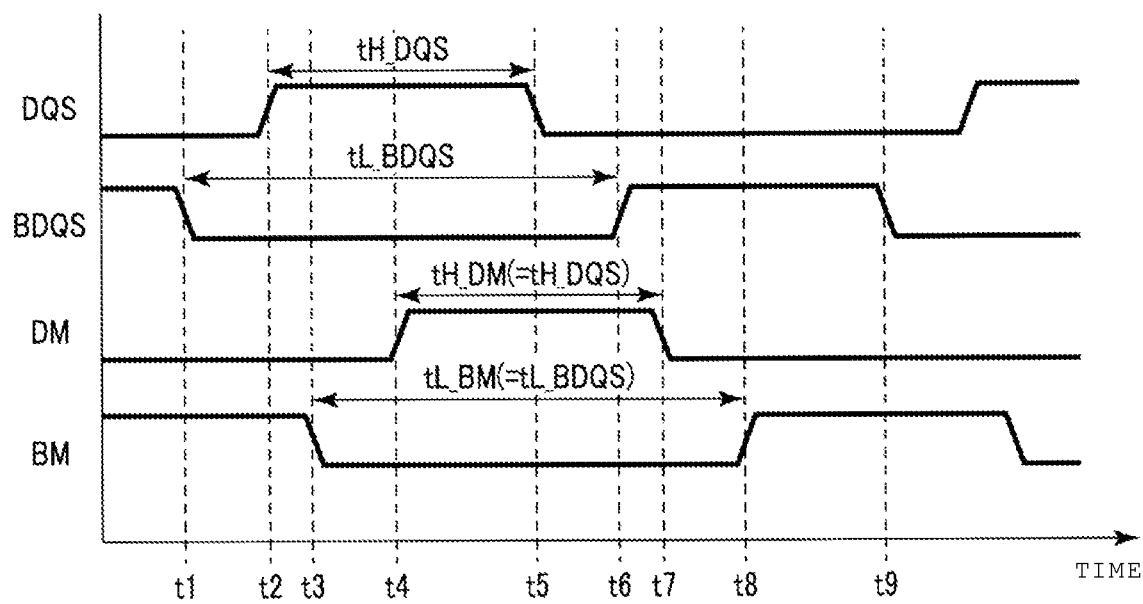
FIG. 14 is a timing chart illustrating the various signals and the potentials of the two nodes in the latch circuit for data input in the semiconductor device according to the third embodiment.

As illustrated in FIG. 14, at a time point t1, the signal BDQS is transitioned from an "H" level to an "L" level.

At a time point t2, the signal DQS is transitioned from an "L" level to an "H" level. A period of the time points t1 to t2 corresponds to the HL difference.

At a time point t3, the correction circuit CR causes the signal BM to be transitioned from an "H" level to an "L" level. More specifically, the output signal of the inverter IV8 (inversion signal ("H" level) of the signal BDQS) is input to the inverters IV30 and IV31. Thus, in the inverter IV30, the transistors P30a and P30b go into an OFF state and the transistors N30a and N30b go into an ON state. Since the inverter IV31 outputs a signal of an "L" level, the transistor N30c is in an OFF state. Further, since the transistor IV29 outputs a signal of an "L" level, the transistor P30c is in an ON state. Thus, an output of the inverter IV30 has an "H" level via the transistor N30a.

At a time point t4, the correction circuit CR causes the signal DM to be transitioned from an "L" level to an "H" level. More specifically, the output signal of the inverter IV4 (inversion signal ("L" level) of the signal DQS) is input to the inverters IV28 and IV29. Thus, in the inverter IV28, the transistors P28a and P28b go into an ON state and the transistors N28a and N28b go into an OFF state. Since the inverter IV29 outputs a signal of an "H" level, the transistor P28c is in an OFF state. Further, since the inverter IV31 outputs a signal of an "L" level, the transistor N28c is in an OFF state. Thus, the output of the inverter IV28 has an "H" level via the transistor P28a.

At a time point t5, the signal DQS is transitioned from an "H" level to an "L" level. A period of the time points t2 to t5 corresponds to the period tH_DQS.

At a time point t6, the signal BDQS is transitioned from an "L" level to an "H" level. A period of the time points t1 to t6 corresponds to the period tL_BDQS.

At a time point t7, the correction circuit CR causes the signal DM to be transitioned from an "H" level to an "L" level. More specifically, the output signal of the inverter IV4 (inversion signal ("H" level) of the signal DQS) is input to the inverters IV28 and IV29. Thus, in the inverter IV28, the transistors P28a and P28b go into an OFF state and the transistors N28a and N28b go into an ON state. Since the inverter IV29 outputs a signal of an "L" level, the transistor P28c is in an ON state. Further, since the inverter IV31 outputs a signal of an "L" level, the transistor N28c is in an OFF state. Thus, the output of the inverter IV28 has an "L" level via the transistor N28a. At this time, a period of the time point t4 to the time point t7, that is, the period tH_DM has a length which is substantially the same as that of the period tH_DQS.

At a time point t8, the correction circuit CR causes the signal BM to be transitioned from an "L" level to an "H" level. More specifically, the output signal of the inverter IV8 (inversion signal ("L" level) of the signal BDQS) is input to the inverters IV30 and IV31. Thus, in the inverter IV30, the transistors P30a and P30b go into an ON state and the transistors N30a and N30b go into an OFF state. Since the inverter IV31 outputs a signal of an "H" level, the transistor N30c is in an ON state. Further, since the transistor IV29 outputs a signal of an "L" level, the transistor P30c is in an ON state. Thus, the output of the inverter IV30 has an "H" level via the transistors P30a to P30b. At this time, a period of the time point t3 to the time point t8, that is, the period tL_BM has a length which is substantially the same as that of the period tL_BDQS.

Thus, the correction circuit CR according to the third embodiment does not correct the HL difference in a case where the period of an "H" level is short.

However, in a case where the period of an "H" level is short, a different correction circuit for correcting the HL difference may be further provided. As noted above, in such a correction circuit, the position of the correction circuit CR and the position of the inverters IV17 and IV19 are swapped.

3. 3 Effects According to Third Embodiment

With the configuration according to the third embodiment, it is possible to obtain an effect which is similar to that in the first and second embodiments. The effect will be described below.

First, an influence of the HL difference on the latch DIN will be described with reference to FIGS. 15 and 16. In the example in FIG. 15, an example of the signals DA, CKp, and CKn and the potential at the node NA in a case where the period of an "L" level is short is described. In the example in FIG. 16, an example of the signals DA, CKp, and CKn and the potential at the node NA in a case where the period of an "H" level is short is described.

Figure 15:
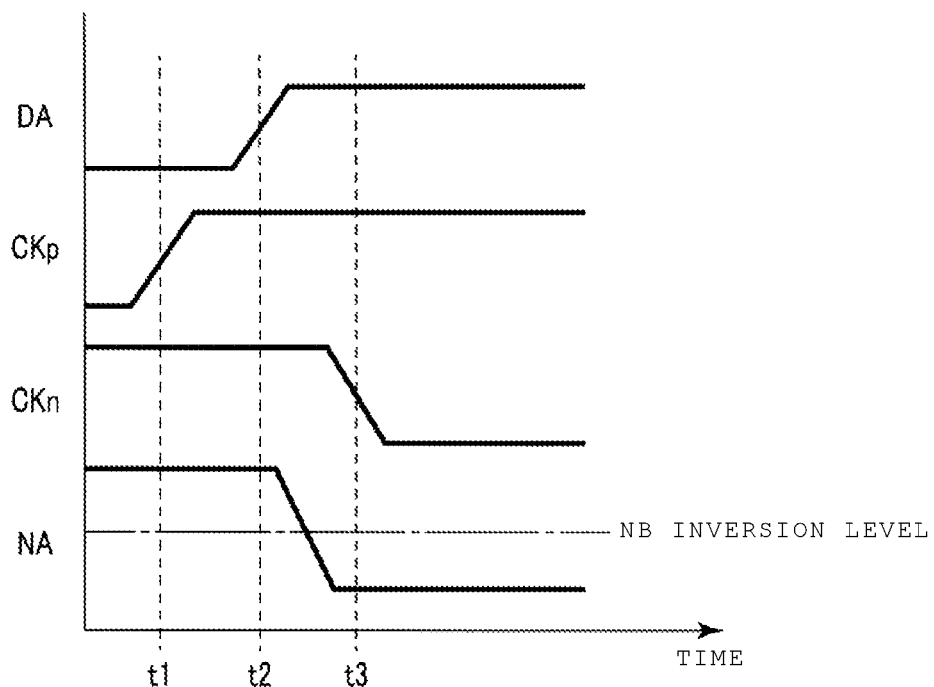
FIG. 15 is a timing chart illustrating an example of the various signals and the potentials of the two nodes in the latch circuit for data input.

As illustrated in FIG. 15, in a case where the period of an "L" level is short, for example, at a time point t1, the signal CKp is transitioned from an "L" level to an "H" level. At this time, since the signals CKp and CKn have an "H" level, the transistor P12b in the inverter IV12 goes into an OFF state and the transistor N12b goes into an ON state. At a time point t2, the signal DA is transitioned from an "L" level to an "H" level. At this time, since the transistor P12b is in an OFF state, an influence of a capacitive load by the p-channel MOS transistor on an operation of the inverter IV12 is relatively small. Thus, it can be considered that the inverter IV12 is driven only by the transistors N12a and N12b. Thus, the signal at the node NA is discharged more rapidly than in a case where the HL difference does not occur. That is, the transition speed at the node NA becomes faster.

Figure 16:
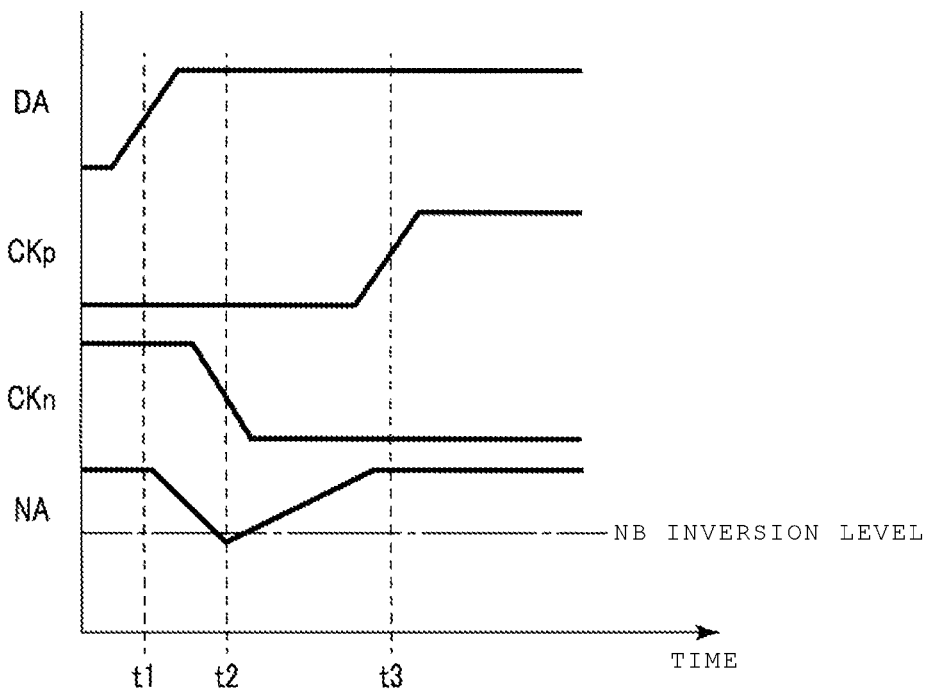
FIG. 16 is a timing chart illustrating an example of the various signals and the potentials of the two nodes in the latch circuit for data input.

As illustrated in FIG. 16, in a case where the period of an "H" level is short, for example, at a time point t1, the signal DA is transitioned from an "L" level to an "H" level. At this time, the signal CKp has an "L" level and the signal CKn has an "H" level. Thus, the transistors P12b and N12b in the inverter IV12 are in an ON state. Thus, the influence of the capacitive load by the p-channel MOS transistor on the operation of the inverter IV12 is increased in comparison to that in the example in FIG. 15. Thus, the transition speed at the node NA becomes slower than that in the example in FIG. 15.

At a time point t2, if the signal CKn is transitioned from an "H" level to an "L" level, the transistor N12b goes into an OFF state. Therefore, discharging at the node NA is ended. At this time, the inverter IV12 ends discharging at the node NA in a state where the level at the node NA is slightly lower than an inversion level at the node NB. If the discharging is ended, the potential at the node NB has an "L" level (in state of being not increased up to an "H" level). Thus, the transistor P13a in the inverter IV13 goes into an ON state. Further, since the signal CKn has an "L" level, the transistor P13b also goes into an ON state. Thus, since the inverter IV13 charges the potential at the node NA, the potential at the node NA is brought back to an "H" level. At a time point t3, if the signal CKp is transitioned from an "L" level to an "H" level, the transistor N13b in the inverter IV13 goes into an ON state and the logical level at the node NA is determined to be an "H" level. If the period of an "H" level is reduced, it is not possible to sufficiently secure a discharging period at the node NA and it may be not possible to latch an inversion signal of the signal DA.

Thus, in a case where HL difference between the signals DQS and BDQS (signals CKn and CKp) occurs, an operation timing of the p-channel MOS transistor is shifted from an operation timing of then-channel MOS transistor (time difference occurs) in the inverter IV12. Variation in a charging or discharging speed at the node NA occurs. Thus, it may not be possible to properly latch the signal DA (input signal I/O). Thus, it is necessary that the set-up period/holding period is set in consideration of the HL difference, and the set-up period/holding period tends to become longer. If the set-up period/holding period becomes longer, it is not possible to increase the speed of data reception in the input I/F. Thus, the processing speed of a semiconductor device is lowered.

However, the correction circuit CR according to the third embodiment may be added to the configuration, so that it is possible to reduce the HL difference (correct the duty ratio) by the correction circuit CR. For example, in a case where the period of an "L" level is short, it is possible to delay a transition start time when the signal CKp is transitioned from an "L" level to an "H" level. Thus, it is possible to reduce variation in the transition speed at the node NA. Accordingly, since the influence of the HL difference is reduced, it is possible to reduce the set-up period/holding period of the latch circuit DIN for data input, and to increase the speed of data reception in the input I/F 410. Thus, it is possible to improve the processing speed of a semiconductor device.

4. Fourth Embodiment

Next, a semiconductor device according to a fourth embodiment will be described. In the fourth embodiment, a configuration of a latch circuit DIN for data input, which is obtained by combining the components in the first to the third embodiments will be described. Only points which are different from that in the first to third embodiments will be described below.

4. 1 Configuration of Latch Circuit for Data Input

The configuration of the latch circuit DIN for data input will be described with reference to FIG. 17.

Figure 17:
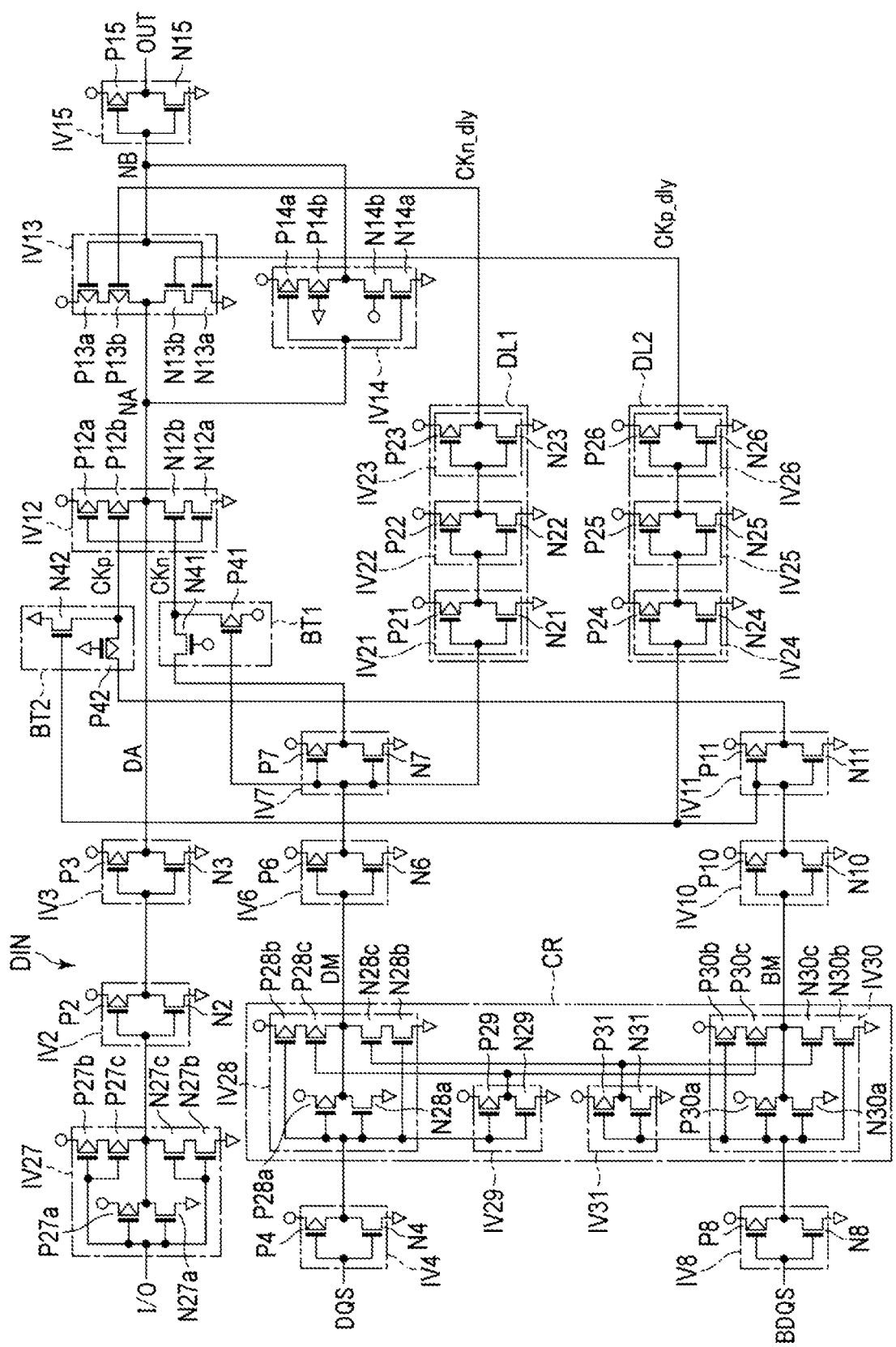
FIG. 17 is a circuit diagram illustrating a latch circuit for data input in a semiconductor device according to a fourth embodiment.

As illustrated in FIG. 17, the latch DIN includes the inverters IV2 to IV4, IV6 to IV8, and IV10 to IV15, the BT circuits BT1 and BT2, the delay circuits DL1 and DL2, and the correction circuit CR. The configurations of each of the inverters, the BT circuits BT1 and BT2, the delay circuits DL1 and DL2, and the correction circuit CR1 are the same as those in the first to the third embodiments.

The inverters IV27, IV2, and IV3 are connected in series. The input signal I/O is input to the input terminal of the inverter IV27. The output terminal of the inverter IV3 is connected to the input terminal of the inverter IV12. An inversion signal DA of the input signal I/O, which is delayed by the inverters IV27, IV2, and IV3 is input to the inverter IV12.

The signal DQS is input to the input terminal of the inverter IV4. The output terminal of the inverter IV4 is connected to the input terminals of the inverters IV28 and IV29 in the correction circuit CR.

The signal BDQS is input to the input terminal of the inverter IV8. The output terminal of the inverter IV8 is connected to the input terminals of the inverters IV30 and IV31 in the correction circuit CR.

The output terminal of the inverter IV28 in the correction circuit CR is connected to the input terminal of the inverter IV6. The output terminal of the inverter IV30 is connected to the input terminal of the inverter IV10.

The output terminal of the inverter IV6 is connected to the input terminal of the inverter IV7, the gate of the transistor P41 in the BT circuit BT1, and the input terminal of the delay circuit DL1.

The output terminal of the inverter IV7 is connected to one end of a current path of the transistor N41 in the BT circuit BT1.

The gate of the transistor N41 in the BT circuit BT1 is connected to the power-supply voltage terminal. The other end of the current path is connected to the drain of the transistor P41 and the gate of the n-channel MOS transistor N12b in the inverter IV12. A source of the transistor P41 is connected to the power-supply voltage terminal.

The output terminal of the inverter IV10 is connected to the input terminal of the inverter IV11, the gate of the transistor N42 in the BT circuit BT2, and the input terminal of the delay circuit DL2.

The output terminal of the inverter IV11 is connected to one end of a current path of the transistor P42 in the BT circuit BT2.

The gate of the transistor P42 in the BT circuit BT2 is grounded. The other end of the current path is connected to the drain of the transistor N42 and the gate of the p-channel MOS transistor P12b in the inverter IV12. The source of the transistor N42 is grounded.

The output terminal of the delay circuit DL1 is connected to the gate of the transistor P13b in the inverter IV13. The output terminal of the delay circuit DL2 is connected to the gate of the transistor N13b in the inverter IV13.

An output terminal of the inverter IV12 is connected to an output terminal of the inverter IV13 and an input terminal of the inverter IV14 via the node NA.

An input terminal of the inverter IV13 is connected to an output terminal of the inverter IV14 and an input terminal of the inverter IV15 via the node NB.

The inverter IV15 outputs inversion data of the node NB to outside of the latch DIN.

4. 2 Effects according to Fourth Embodiment

With the configuration according to the fourth embodiment, it is possible to obtain an effect which is similar to that in the first to third embodiments. It is possible to reduce the set-up period/holding period of the latch circuit DIN for data input and to increase the speed of data reception in the input I/F 410, by combining the components in the first to the third embodiments. Thus, it is possible to improve the processing speed of a semiconductor device.

5. Modification Example

The semiconductor device according to the above embodiments includes the input receiver (IR in FIG. 4) and the latch circuit for data input (DIN in FIG. 4) connected to the input receiver. The latch circuit for data input includes the first inverter (IV3 in FIG. 5), the second inverter (IV7 in FIG. 5), the third inverter (IV11 in FIG. 5), the first clock generation circuit (BT1 in FIG. 5), the second clock generation circuit (BT2 in FIG. 5), the fourth inverter (IV12 in FIG. 5), and the latch circuit (IV13 and IV14 in FIG. 5). The first inverter outputs the first signal (DA in FIG. 5) based on the input signal (I/O in FIG. 5) received from the input receiver. The second inverter outputs a first clock signal based on the first strobe signal (DQS in FIG. 5). The third inverter outputs a second clock signal based on the second strobe signal (BDQS in FIG. 5) which is an inversion signal of the first strobe signal. The first clock generation circuit is connected to the output terminal of the second inverter and generates the third clock signal (CKn in FIG. 5) having a transition start which is delayed relative to the transition start of the logical level of the first clock signal and having a transition speed faster than the transition speed of the logical level of the first clock signal. The second clock generation circuit is connected to the output terminal of the third inverter and generates the fourth clock signal (CKp in FIG. 5) having a transition start which is delayed relative to a transition start of the logical level of the second clock signal and having a transition speed faster than a transition speed of the logical level of the second clock signal. The fourth inverter outputs an inversion signal of the first signal in accordance with the third and fourth clock signals. The latch circuit latches the output signal of the fourth inverter in accordance with the third and fourth clock signals.

It is possible to provide a semiconductor device which can improve processing speed, by applying the above embodiments.

The embodiments are not limited to the form described above. Various modifications can be made.

For example, in the embodiment, the components as many as possible can be combined.

Further, the semiconductor device in the above embodiments is not limited to a memory system which includes a NAND flash memory. The core chip may include a memory other than the NAND flash memory.

Further, a circuit other than the inverter may be used in the delay circuits DL1 and DL2 in the above embodiments.

In addition, "connection" in the above embodiments also includes a state where the components are indirectly connected with an object (for example, a transistor, a resistor, or the like) being interposed between the components.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a memory cell capable of storing data;
   a first terminal through which a first data signal is input;
   a second terminal through which a first strobe signal is input;
   a third terminal through which a second strobe signal is input;
   a first signal receiver circuit configured to receive the first data signal via the first terminal; and
   a first latch circuit connected to the first signal receiver circuit, wherein
   the first latch circuit includes
      a plurality of series-connected first inverters configured to receive the first data signal at an input terminal of a first one of the first inverters and to output a second data signal from an output terminal of a last one of the first inverters,
      a plurality of series-connected second inverters configured to receive the first strobe signal at an input terminal of a first one of the second inverters and to output a first clock signal from an output terminal of a last one of the second inverters,
      a plurality of series-connected third inverters configured to receive the second strobe signal at an input terminal of a first one of the third inverters and to output a second clock signal from an output terminal of a last one of the third inverters,
      a first clock generation circuit which is connected to the output terminal of the last one of the second inverters and is configured to generate a third clock signal based on the first clock signal, a transition period of the third clock signal being shorter than a transition period of the first clock signal,
      a second clock generation circuit which is connected to the output terminal of the last one of the third inverters and is configured to generate a fourth clock signal based on the second clock signal, a transition period of the fourth clock signal being shorter than a transition period of the second clock signal,
      a fourth inverter configured to output an inversion signal of the second data signal from an output terminal in accordance with the third clock signal and the fourth clock signal, and
      a data latch circuit connected to the output terminal of the fourth inverter and configured to latch the inversion signal output from the output terminal of the fourth inverter in accordance with the first clock signal and the second clock signal.

2. The semiconductor device according to claim 1, wherein:
   the first clock generation circuit includes
      a first n-channel type transistor having a gate terminal connected to a first power-supply voltage terminal, one terminal connected to the output terminal of the last one of the second inverters, and the other terminal connected to an output terminal of the first clock generation circuit, and
      a first p-channel type transistor having a gate terminal connected to an output terminal of a penultimate one of the second inverters, one terminal connected to the first power-supply voltage terminal, and the other terminal connected to the output terminal of the first clock generation circuit; and
   the second clock generation circuit includes
      a second p-channel type transistor having a gate terminal connected to a second power-supply voltage terminal, one terminal connected to the output terminal of the last one of the third inverters, and the other terminal connected to an output terminal of the second clock generation circuit, and
      a second n-channel type transistor having a gate terminal connected to an output terminal of a penultimate one of the third inverters, one terminal connected to the second power-supply voltage terminal, and the other terminal connected to the output terminal of the second clock generation circuit.

3. The semiconductor device according to claim 1, wherein
   the data latch circuit includes a fifth inverter and a sixth inverter, an input terminal of the fifth inverter being connected to an output terminal of the sixth inverter, an output terminal of the sixth inverter being connected to an input terminal of the fifth inverter and the output terminal of the fourth inverter.

4. The semiconductor device according to claim 3, wherein
   the fifth inverter is deactivated when the fourth inverter is activated, and the fifth inverter is activated when the fourth inverter is deactivated.

5. The semiconductor device according to claim 4, wherein
   the data latch circuit latches the inversion signal output from the output terminal of the fourth inverter when the fifth inverter is activated and the fourth inverter is deactivated.

6. The semiconductor device according to claim 3, further comprising:
   a seventh inverter having an input terminal connected to the output terminal of the fifth inverter and an output terminal from which data to be written into the memory cell is output.

7. The semiconductor device according to claim 3, wherein:
the fourth inverter includes
a third p-channel type transistor and a fourth p-channel type transistor connected in series between a third power-supply voltage terminal and the output terminal of the fourth inverter, and
a third n-channel type transistor and a fourth n-channel type transistor connected in series between a fourth power-supply voltage terminal and the output terminal of the fourth inverter;
the second data signal is supplied to one of a gate terminal of the third p-channel type transistor and a gate terminal of the fourth p-channel type transistor and to one of a gate terminal of the third n-channel type transistor and a gate terminal of the fourth n-channel type transistor;
one of the third clock signal and the fourth clock signal is supplied to the other one of the gate terminal of the third p-channel type transistor and the gate terminal of the fourth p-channel type transistor; and
the other one of the third clock signal and the fourth clock signal is supplied to the other one of the gate terminal of the third n-channel type transistor and the gate terminal of the fourth n-channel type transistor.

8. The semiconductor device according to claim 7, wherein:
the fifth inverter includes
a fifth p-channel type transistor and a sixth p-channel type transistor connected in series between a fifth power-supply voltage terminal and the output terminal of the fourth inverter, and
a fifth n-channel type transistor and a sixth n-channel type transistor connected in series between a sixth power-supply voltage terminal and the output terminal of the fourth inverter;
the output terminal of the sixth inverter is connected to one of a gate terminal of the fifth p-channel type transistor and a gate terminal of the sixth p-channel type transistor and to one of a gate terminal of the fifth n-channel type transistor and a gate terminal of the sixth n-channel type transistor;
the other one of the third clock signal and the fourth clock signal is supplied to the other one of the gate terminal of the fifth p-channel type transistor and the gate terminal of the sixth p-channel type transistor; and
the one of the third clock signal and the fourth clock signal is supplied to the other one of the gate terminal of the fifth n-channel type transistor and the gate terminal of the sixth n-channel type transistor.

* * * * *